United States Patent
Wan et al.

(10) Patent No.: US 11,631,716 B2
(45) Date of Patent: *Apr. 18, 2023

(54) CROSS-POINT SPIN-TRANSFER TORQUE MAGNETORESISTIVE MEMORY ARRAY AND METHOD OF MAKING THE SAME

(71) Applicant: WESTERN DIGITAL TECHNOLOGIES, INC., San Jose, CA (US)

(72) Inventors: Lei Wan, San Jose, CA (US); Jordan Katine, Mountain View, CA (US); Tsai-Wei Wu, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/477,958

(22) Filed: Sep. 17, 2021

(65) Prior Publication Data

US 2022/0005867 A1 Jan. 6, 2022

Related U.S. Application Data

(62) Division of application No. 16/666,967, filed on Oct. 29, 2019, now Pat. No. 11,152,425.

(51) Int. Cl.
*G11C 11/00* (2006.01)
*H01L 27/22* (2006.01)
(Continued)

(52) U.S. Cl.
CPC ............ *H01L 27/224* (2013.01); *H01L 43/02* (2013.01); *H01L 43/12* (2013.01)

(58) Field of Classification Search
CPC ................................ G11C 17/02; G11C 11/16
See application file for complete search history.

(56) References Cited

U.S. PATENT DOCUMENTS 7,285,464 B2 * 10/2007 Herner ................... G11C 17/06
438/257
7,502,211 B2 3/2009 Gill
(Continued)

FOREIGN PATENT DOCUMENTS

JP 5585212 B2 9/2014
KR 20130129046 A 11/2013
WO WO 2019-139774 7/2019

OTHER PUBLICATIONS

Notification of Transmittal of the International Search Report and Written Opinion of the International Search Authority for International Patent Application No. PCT/US2020/023707, dated Jul. 28, 2020, 10 pages.
(Continued)

*Primary Examiner* — Pho M Luu
(74) *Attorney, Agent, or Firm* — The Marbury Law Group PLLC

(57) ABSTRACT

A memory device includes a cross-point array of spin-torque transfer MRAM cells. First rail structures laterally extend along a first horizontal direction. Each of the first rail structures includes a vertical stack including, from bottom to top, a first electrically conductive line, a reference layer having a fixed magnetization direction, and a tunnel barrier layer. Second rail structures laterally extend along a second horizontal direction. Each of the second rail structures includes a second electrically conductive line that overlies the first rail structures. A two-dimensional array of pillar structures is located between a respective one of the first rail structures and a respective one of the second rail structures. Each of the pillar structures includes a free layer having energetically stable magnetization orientations that are parallel or antiparallel to the fixed magnetization direction.

7 Claims, 23 Drawing Sheets

(51) Int. Cl.
*H01L 43/12* (2006.01)
*H01L 43/02* (2006.01)

(56) References Cited

U.S. PATENT DOCUMENTS

| | | | |
|---|---|---|---|
| 7,733,685 | B2 | 6/2010 | Scheuerlein et al. |
| 10,249,683 | B1 | 4/2019 | Lille et al. |
| 10,748,966 | B2 * | 8/2020 | Mayuzumi .......... H01L 45/1253 |
| 11,152,426 | B2 * | 10/2021 | Hsiao .................... H01L 27/222 |
| 11,264,562 | B1 * | 3/2022 | Prasad .................... H01L 43/08 |
| 2003/0022420 | A1 | 1/2003 | Kleveland et al. |
| 2009/0290406 | A1 | 11/2009 | Xia et al. |
| 2009/0290409 | A1 | 11/2009 | Xia et al. |
| 2010/0054027 | A1 | 3/2010 | Xia |
| 2010/0110776 | A1 | 5/2010 | Yoon et al. |
| 2011/0267874 | A1 | 11/2011 | Ryu et al. |
| 2013/0201757 | A1 | 8/2013 | Li et al. |
| 2013/0215675 | A1 | 8/2013 | Ryu et al. |
| 2017/0004751 | A1 | 2/2017 | Chen et al. |
| 2018/0366642 | A1 | 12/2018 | Yang et al. |
| 2019/0013353 | A1 | 1/2019 | Lee et al. |
| 2019/0207088 | A1 | 7/2019 | Schabes et al. |
| 2021/0126052 | A1 | 4/2021 | Wan et al. |

OTHER PUBLICATIONS

U.S. Appl. No. 16/401,172, filed May 2, 2019, SanDisk Technologies LLC.

* cited by examiner

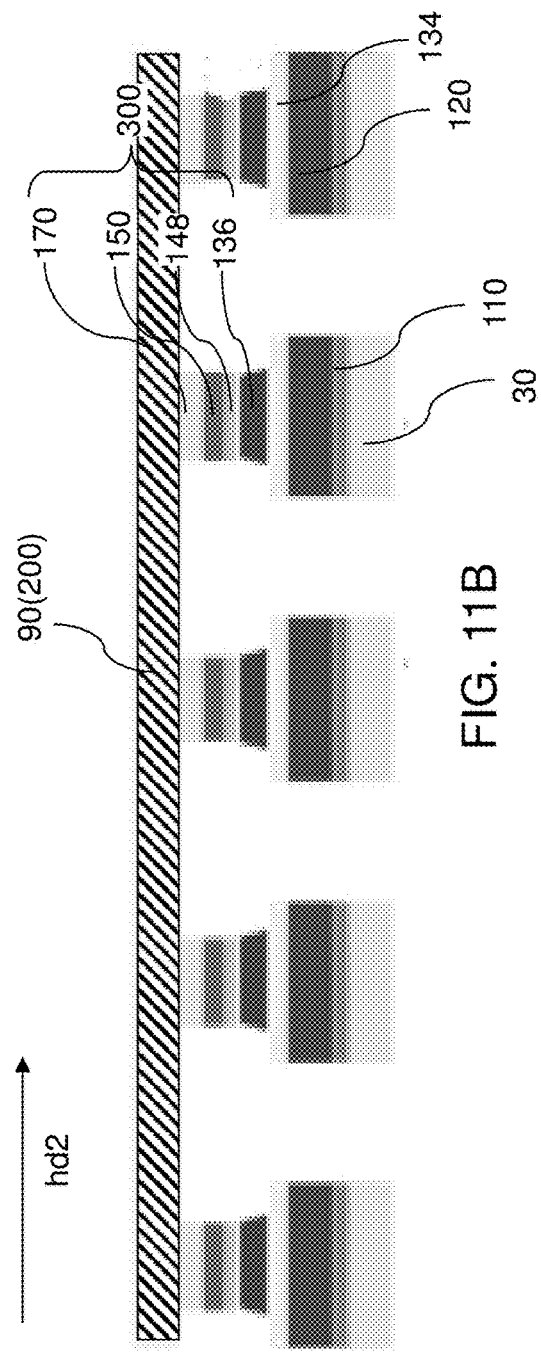
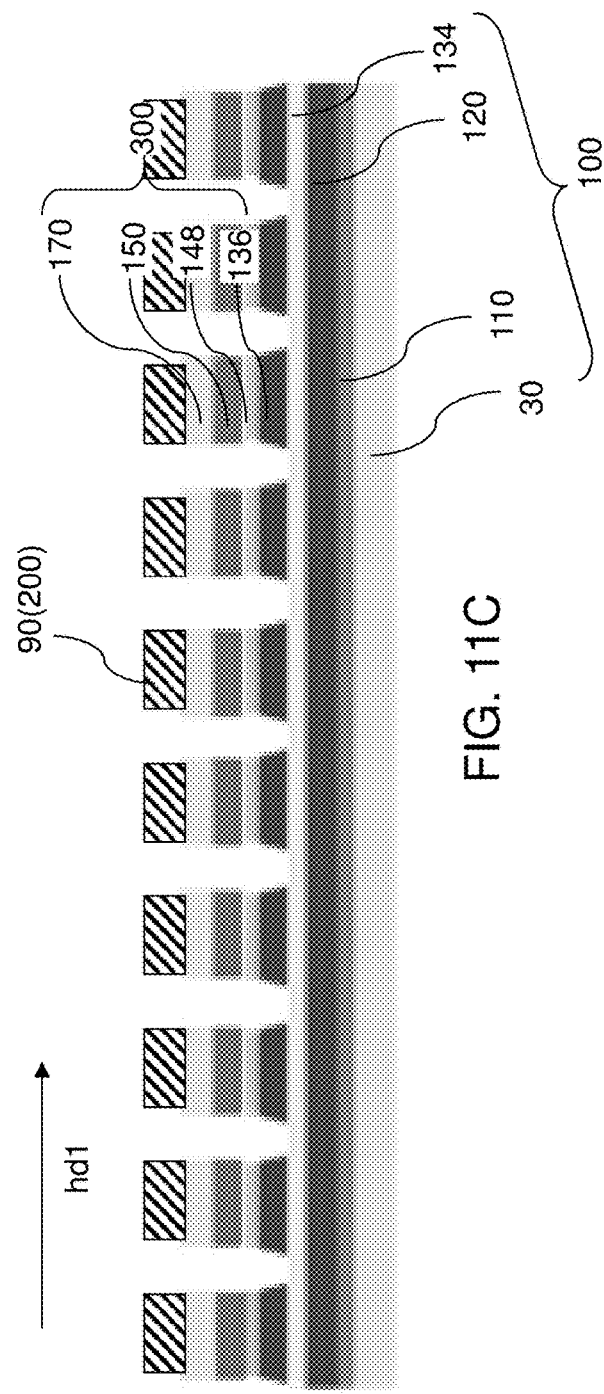

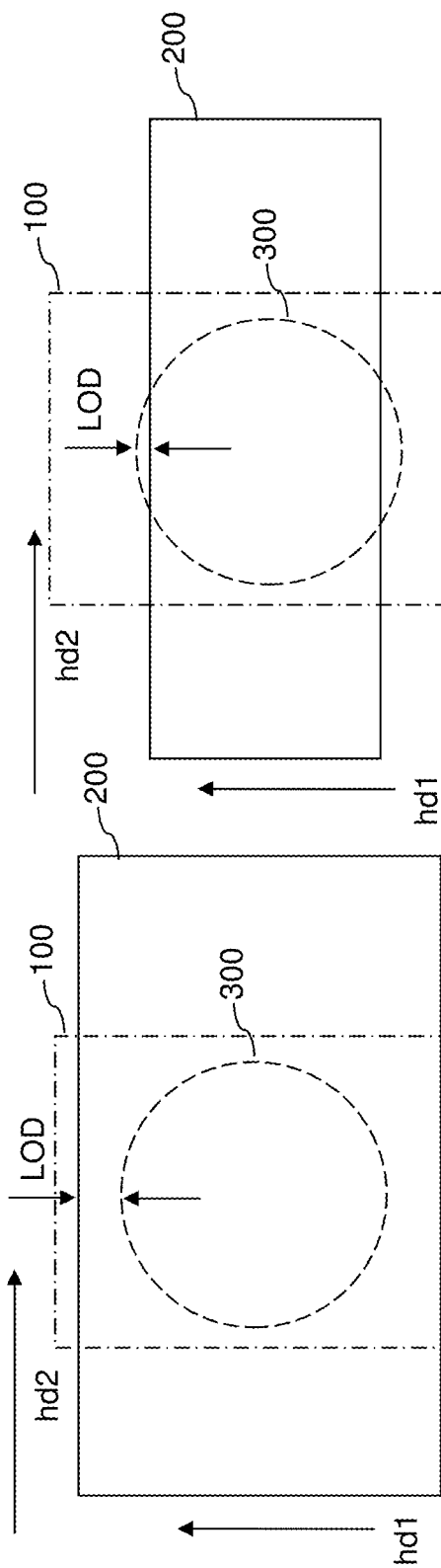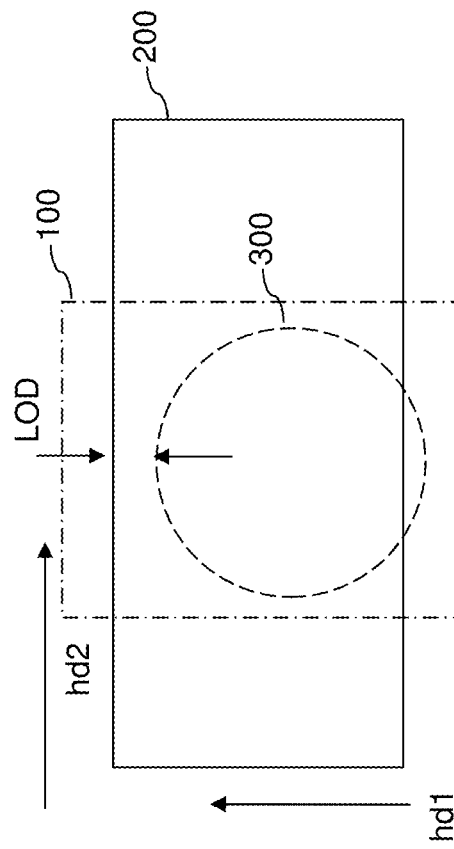

CROSS-POINT SPIN-TRANSFER TORQUE MAGNETORESISTIVE MEMORY ARRAY AND METHOD OF MAKING THE SAME

FIELD

The present application is a divisional of U.S. Application Ser. No. 16/666,967, filed Oct. 29, 2019, now U.S. Pat. No. 11,152,425 B2. The present disclosure relates generally to the field of magnetic memory devices, and particular to a cross-point spin-transfer torque MRAM array and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a memory device including a two-dimensional array of spin-torque transfer MRAM cells is provided. The memory device comprises: first rail structures that laterally extend along a first horizontal direction and laterally spaced apart from each other, wherein each of the first rail structures comprises a vertical stack including, from bottom to top, a first electrically conductive line, a reference layer having a fixed magnetization direction, and a tunnel barrier layer; second rail structures that laterally extend along a second horizontal direction that is different from the first horizontal direction and laterally spaced apart from each other, wherein each of the second rail structures comprises a second electrically conductive line that overlies the first rail structures; and a two-dimensional array of pillar structures located between a respective one of the first rail structures and a respective one of the second rail structures, wherein each of the pillar structures comprises a free layer having energetically stable magnetization orientations that are parallel or antiparallel to the fixed magnetization direction of the reference layer.

According to another aspect of the present disclosure, a method of forming a memory device including a two-dimensional array of spin-torque transfer MRAM cells is provided. The method comprises the steps of: forming a layer stack comprising a first continuous electrically conductive layer, a continuous reference layer, a continuous nonmagnetic tunnel barrier layer, and a continuous free magnetization material layer over a substrate; forming first rail structures that laterally extend along a first horizontal direction and laterally spaced apart from each other by patterning a subset of layers within the layer stack, wherein each of the first rail structures comprises a vertical stack including, from bottom to top, a first electrically conductive line including a respective patterned portion of the first continuous electrically conductive layer, a reference layer including a respective patterned portion of the continuous reference layer, and a tunnel barrier layer including a patterned portion of the continuous nonmagnetic tunnel barrier layer; forming a two-dimensional array of pillar structures by patterning at least the continuous free magnetization material layer, wherein each of the pillar structures comprises a free layer having energetically stable magnetization orientations that are parallel or antiparallel to the fixed magnetization direction of the reference layer; and forming second rail structures that laterally extend along a second horizontal direction that is different from the first horizontal direction and laterally spaced apart from each other, wherein each of the second rail structures comprises a second electrically conductive line that overlies the two-dimensional array of pillar structures.

BRIEF DESCRIPTION OF THE DRAWINGS

FIG. 11B is a vertical cross-sectional view along the vertical plane B-B' of FIG. 11A.

FIG. 11C is a vertical cross-sectional view along the vertical plane C-C' of FIG. 11A.

FIG. 11D is a top-down view of a portion of a first configuration of the first exemplary structure according to the first embodiment of the present disclosure.

FIG. 11E is a top-down view of a portion of a second configuration of the first exemplary structure according to the first embodiment of the present disclosure.

FIG. 11F is a top-down view of a portion of a third configuration of the first exemplary structure according to the first embodiment of the present disclosure.

DETAILED DESCRIPTION

Figure 1:
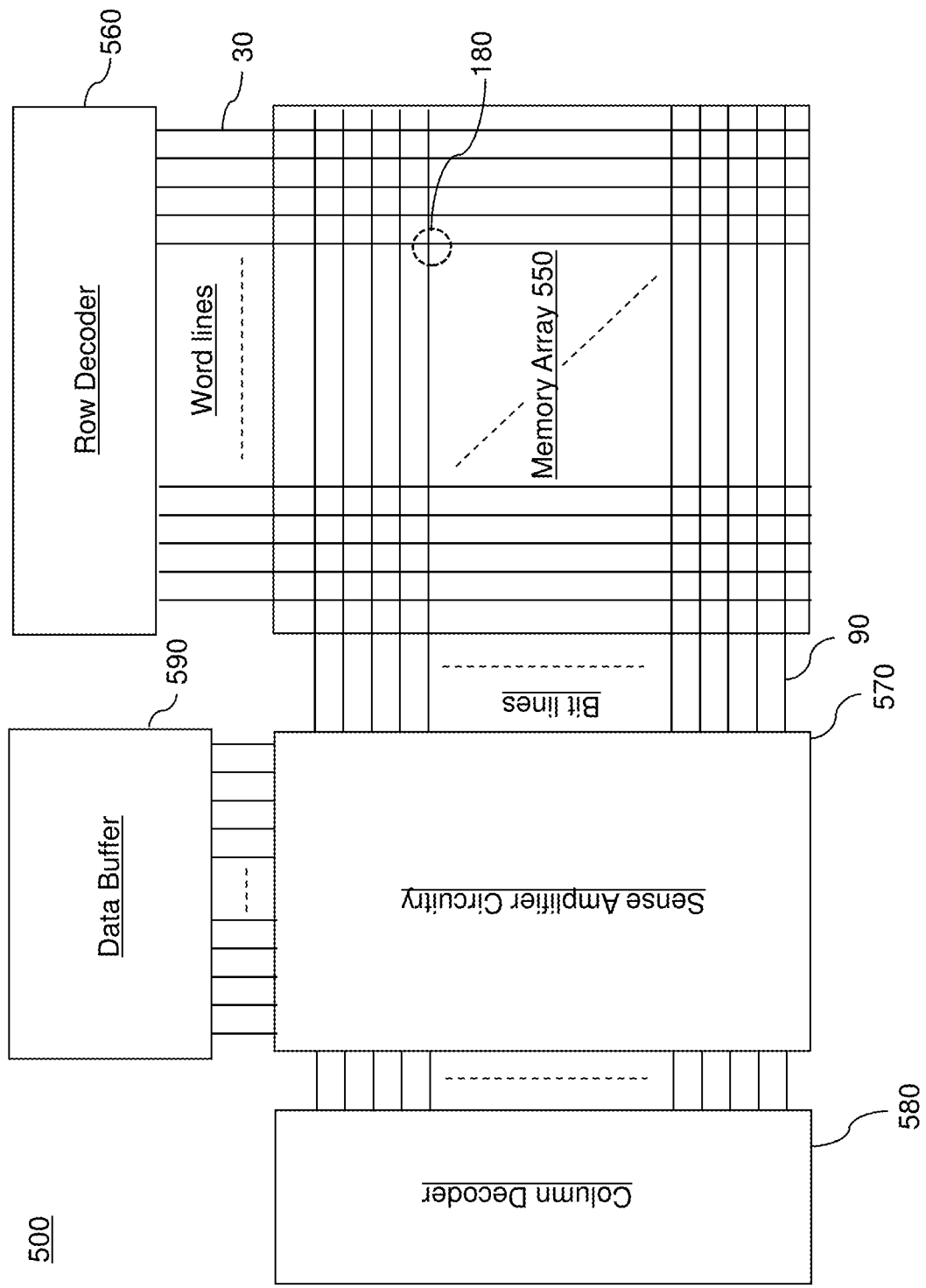
FIG. 1 is a schematic diagram of a memory device including resistive memory cells of the present disclosure in an array configuration.

As discussed above, the present disclosure is directed to a cross-point spin-transfer torque MRAM array and methods of manufacturing the same, the various aspects of which are discussed herein in detail. In some embodiments of the present disclosure, only the free layer is patterned into isolated bits, which permits tighter device pitch and less patterning of the device layers, which simplifies the device manufacturing process.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
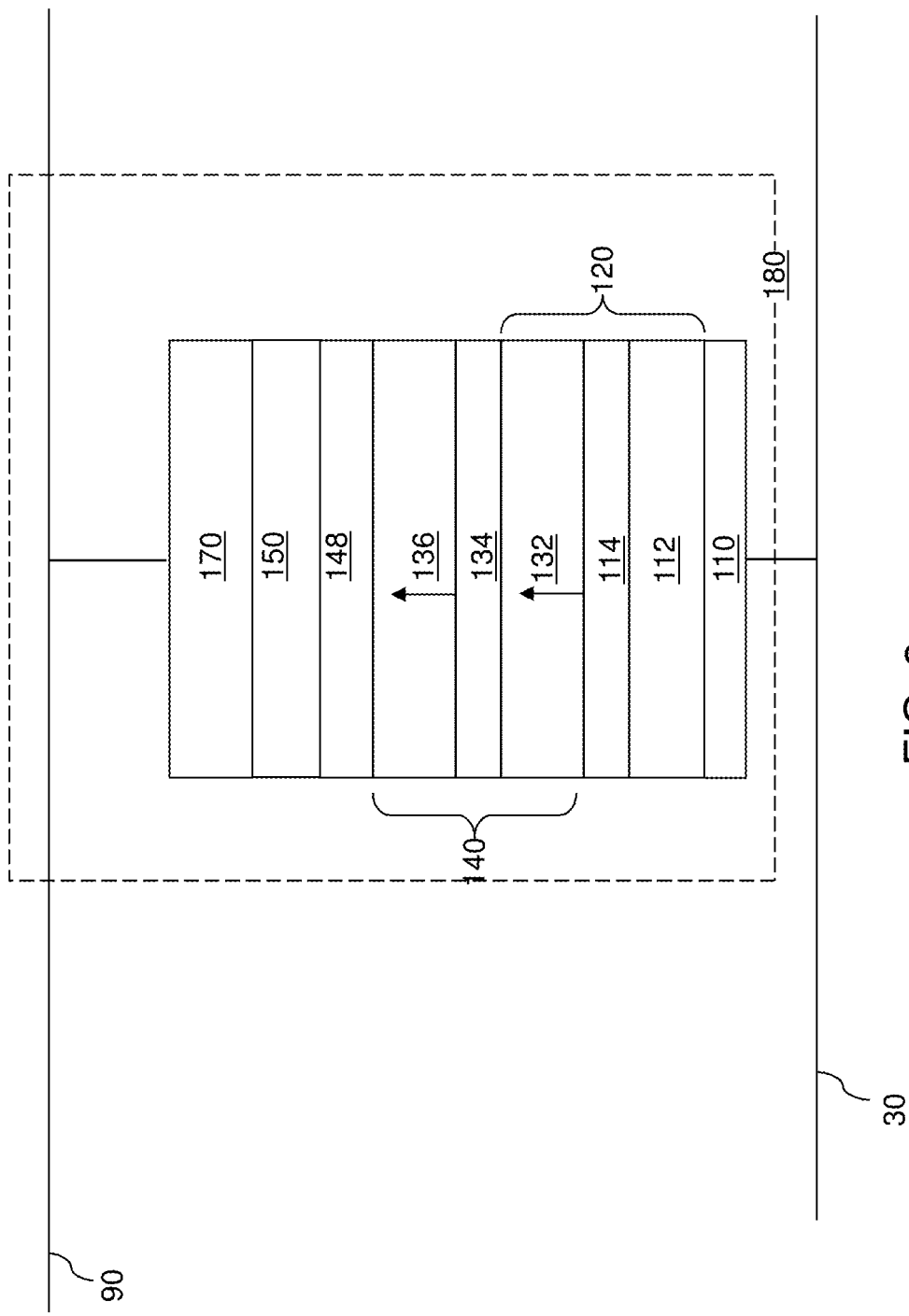
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

A seed layer 110 may be located over the bottom electrode (e.g., word line) 30. The seed layer 110 comprises an electrically conductive metal or alloy, such as titanium, tantalum, platinum, or ruthenium.

Generally, the MRAM cell 180 includes a magnetic tunnel junction (MTJ) 140. The magnetic tunnel junction 140 includes a reference layer 132 (which may also be referred to as a "pinned" layer) having a fixed vertical magnetization, a tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An electrically conductive capping layer 148 may be formed on top of the free layer 136 in order to provide additional perpendicular anisotropy. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

The reference layer 132 can include either a Co/Ni or Co/Pt multilayer structure. In one embodiment, the reference layer 132 can additionally include a thin non-magnetic layer comprised of tantalum or tungsten having a thickness of 0.2 nm-0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over the seed layer 110. For example, the SAF structure 120 can include a vertical stack including a hard layer 112, an antiferromagnetic coupling layer 114, and the reference layer 132. The hard layer 112 includes a ferromagnetic material having perpendicular magnetic anisotropy. The magnetization of the reference layer 132 can be antiferromagnetically coupled to the magnetization of the hard layer 112. Alternatively, the reference layer 132 may be located over an antiferromagnetic layer, such as an IrMn alloy, rather than be included in the SAF structure 120. The antiferromagnetic layer may be used instead of the hard layer 112 and the antiferromagnetic coupling layer 114 of the SAF structure 120.

An electrically conductive capping layer 148 can be formed over the free layer 136. The electrically conductive capping layer 148 can include a nonmagnetic metal layer or multilayers, such as ruthenium, tungsten or tantalum. Optionally, a thin magnesium oxide layer may be formed directly on the free layer 136 with a thickness that is thin enough to enable tunneling of electrical current, such as a thickness in a range from 4 Angstroms to 10 Angstroms. There is no ferromagnetic electrode on top of the electrically conductive capping layer 148. Thus, the MRAM cell 180 can be a single tunnel junction device that includes only one magnetic tunnel junction 140.

A selector 150 can be formed on the electrically conductive capping layer 148. The selector 150 includes a selector material that provides a bidirectional current flow when the current or voltage exceeds a threshold value. Thus, the selector 150 is a bidirectional selector device which permits bidirectional current flow when the current or voltage exceeds a threshold value and blocks current flow when the current or voltage is below the threshold value. The selector 150 may include an ovonic threshold switch material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeTe, SeAs, GeTe, SiTe, or GeSe compound semiconductor material doped with a dopant selected from As, N, and C, such as a Ge—Se—As compound semiconductor material.

The selector 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

In one embodiment, an electrically conductive material layer 170 can be formed over the selector 150. The electrically conductive material layer 170 can include a non-magnetic, electrically conductive material, such as W, Ti, Ta, WN, TiN, TaN, Ru, and Cu. The thickness of the electrically conductive material layer 170 can be in a range from 10 nm to 100 nm, although lesser and greater thicknesses can also be employed. The electrically conductive material layer 170 may be a portion of a second electrically conductive line 90, or may be an electrically conductive structure that underlies the second electrically conductive line 90.

The layer stack including the SAF structure 120, the magnetic tunnel junction 140, the electrically conductive capping layer 148, the selector 150, and the electrically conductive material layer 170 can be annealed to induce crystallographic alignment between the crystalline structure of the nonmagnetic tunnel barrier layer 134 (which may include crystalline MgO having a rock salt crystal structure) and the crystalline structure within the free layer 136.

The location of the first and second terminals may be switched such that the first terminal is electrically connected to the SAF structure 120 and the second terminal is electrically connected to the capping layer 170. The layer stack including the material layers from the SAF structure 120 to the electrically conductive material layer 170 can be deposited in reverse order, i.e., from the SAF structure 120 toward the electrically conductive material layer 170 or from the electrically conductive material layer 170 toward the SAF structure 120. The layer stack can be formed as a stack of continuous layers, and can be subsequently patterned into discrete patterned layer stacks for each MRAM cell 180.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the discrete patterned layer stack (120, 140, 148, 150, 170). The magnetization of the free layer 136 can precess around the vertical direction (i.e., the direction of the flow of the electrical current) during the programming process until the spin transfer torque exerted by the spin-polarized electrical current flips the direction of the magnetization by 180 degrees, at which point the flow of the electrical current can be stopped.

Figure 3:
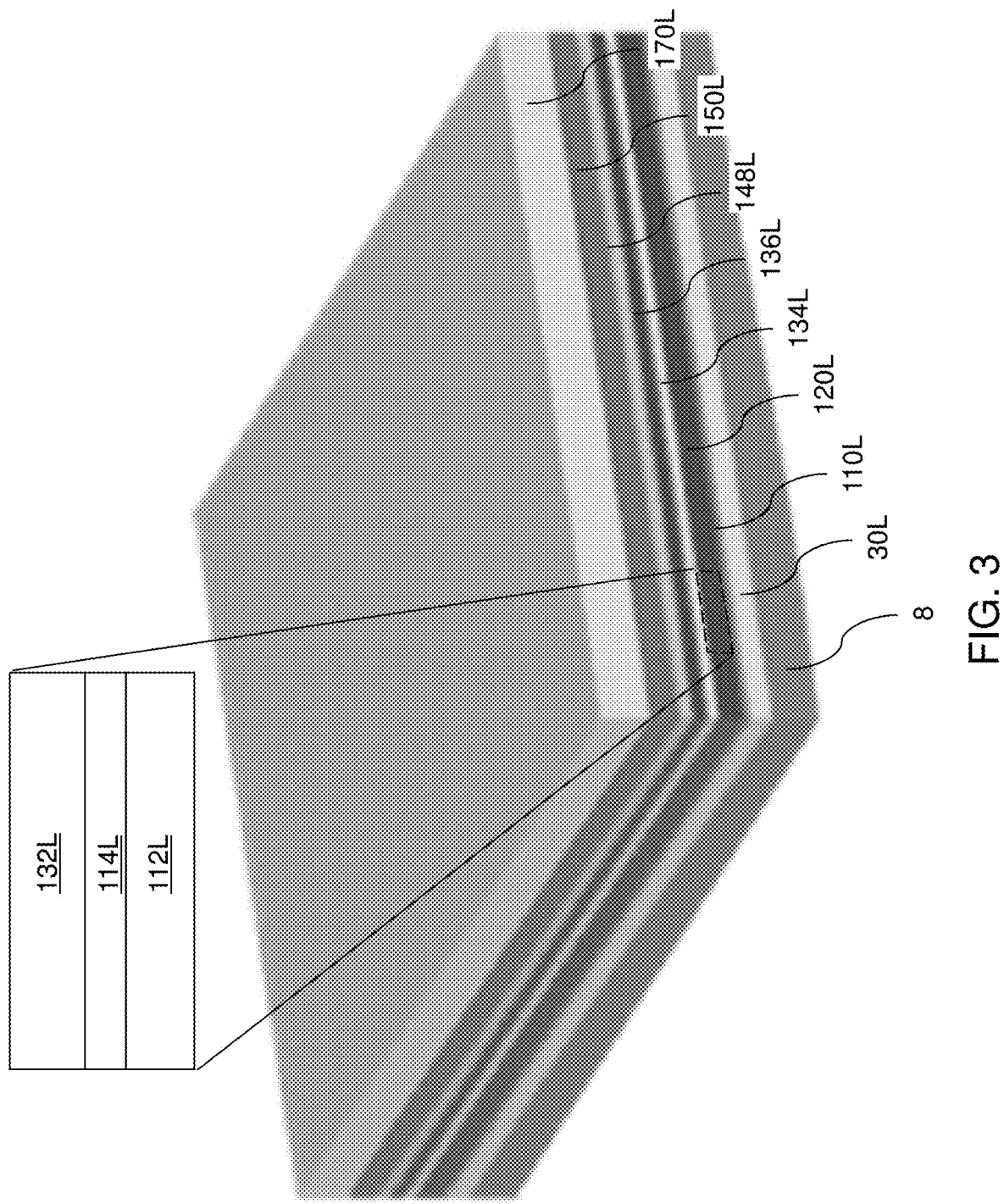
FIG. 3 illustrates a perspective view of a first exemplary structure after formation of a layer stack comprising a first continuous electrically conductive layer, a continuous reference layer, a continuous nonmagnetic tunnel barrier layer, and a continuous free magnetization material layer over a substrate according to a first embodiment of the present disclosure.

Referring to FIG. 3, a first exemplary structure for forming a two-dimensional array of STT MRAM cells 180 is illustrated. The first exemplary structure can be provided by forming a layer stack of blanket (unpatterned) layers over a substrate 8. The layer stack can include, from bottom to top, a first continuous electrically conductive layer 30L, a continuous metallic seed layer 110L, a continuous synthetic antiferromagnetic (SAF) layer stack or combination of a continuous antiferromagnetic layer and ferromagnetic reference layer, a continuous nonmagnetic tunnel barrier layer 134L, a continuous free magnetization material layer 136L, a continuous electrically conductive capping layer 148L, a continuous selector material layer 150L, and a continuous electrically conductive material layer 170L.

The first continuous electrically conductive layer 30L includes a first nonmagnetic electrically conductive material such as Cu, W, Co, Mo, Ti, Ta, TiN, TaN, WN, or combinations thereof. The thickness of the first continuous electrically conductive layer 30L can be in a range from 20 nm to 100 nm, although lesser and greater thicknesses can also be employed.

The continuous metallic seed layer 110L includes a metallic material on which the materials of the continuous SAF layer stack 120L can be formed with perpendicular magnetic anisotropy. In other words, the metallic material of the continuous metallic seed layer 110L includes a material that induces crystallographic alignment of grains of the subsequently deposited material layers. For example, the continuous metallic seed layer 110L can include at least one material selected from titanium, tantalum, platinum, and ruthenium. The thickness of the continuous metallic seed layer 110L can be in a range from 2 nm to 10 nm, although lesser and greater thicknesses can also be employed.

The continuous SAF layer stack 120L can include a layer stack including, from bottom to top, a continuous hard layer 112L that includes the material of the hard layer 112 in the MRAM cell 180 in FIG. 2, a continuous antiferromagnetic coupling layer 114L that includes the material of the antiferromagnetic coupling layer 114 in the MRAM cell 180 in FIG. 2, and a continuous reference layer 132L that includes the material of the reference layer 132 in the MRAM cell 180 in FIG. 2. Alternatively, the continuous reference layer 132L may be located over an antiferromagnetic layer, such as an IrMn alloy, rather than be included in the continuous SAF layer stack 120L.

The continuous nonmagnetic tunnel barrier layer 134L includes the material of the nonmagnetic tunnel barrier layer 134 in the MRAM cell 180 in FIG. 2. The continuous free magnetization material layer 136L includes the material of the free layer 136 in the MRAM cell 180 in FIG. 2. The continuous electrically conductive capping layer 148L includes the material of the electrically conductive capping layer 148 in the MRAM cell 180 in FIG. 2. The continuous selector material layer 150L includes the material of the selector 150 in the MRAM cell 180 of FIG. 2. The continuous electrically conductive material layer 170L includes the material of the electrically conductive material layer 170 in the MRAM cell 180 of FIG. 2.

Figure 4:
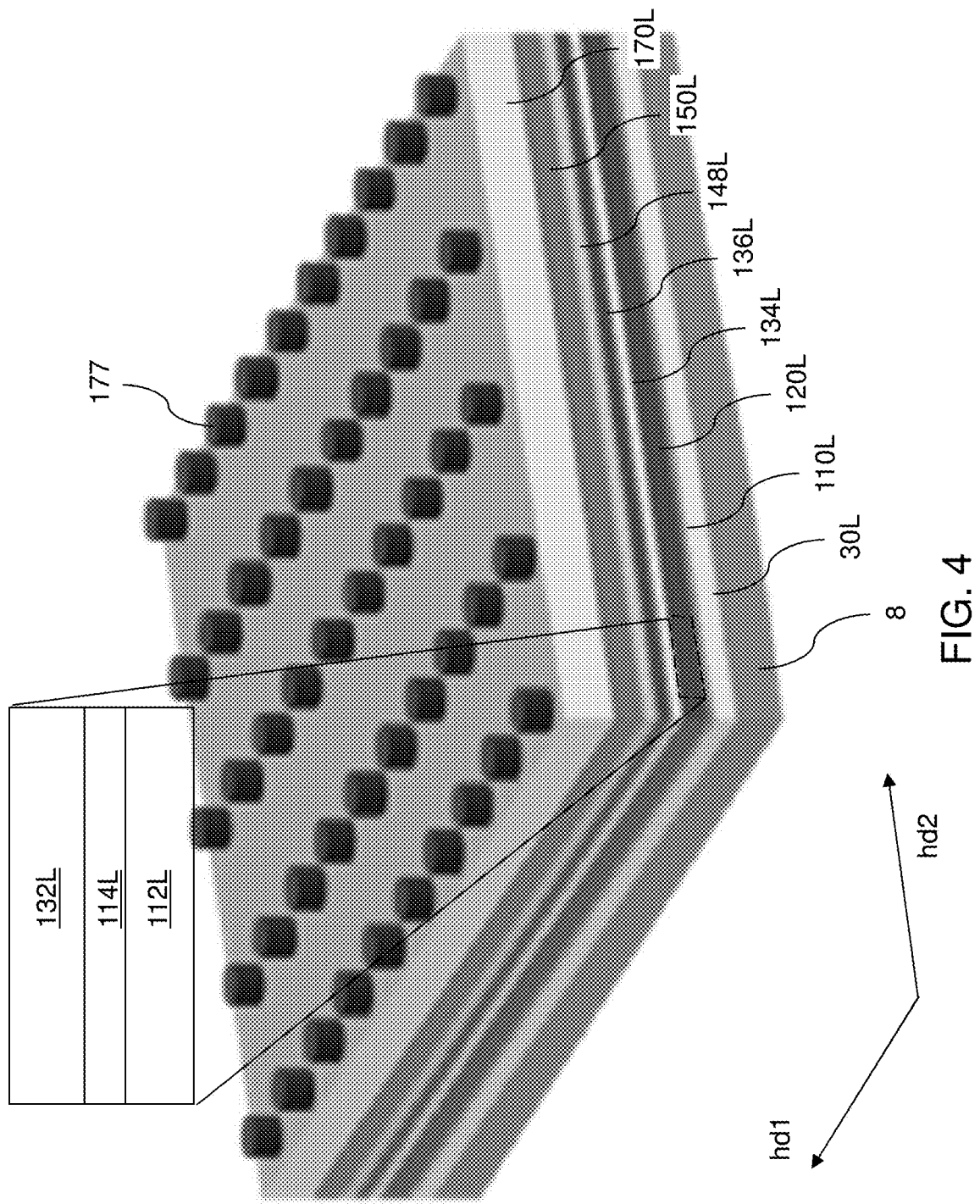
FIG. 4 illustrates a perspective view of the first exemplary structure after formation of a two-dimensional array of discrete masking material portions over the layer stack according to the first embodiment of the present disclosure.

Referring to FIG. 4, a two-dimensional array of discrete masking material portions 177 can be formed over the layer stack (30L, 110L, 120L, 134L, 136L, 148L, 150L, 170L). The two-dimensional array of discrete masking material portions 177 may include a hard mask material (such as silicon oxide, silicon nitride, a dielectric metal oxide, or a metallic material), and/or may include a soft mask material such as a photoresist material. For example, photoresist layer can be applied over the layer stack (30L, 110L, 120L, 134L, 136L, 148L, 150L, 170L), and can be lithographically patterned into a two-dimensional array of patterned photoresist material portions, which can constitute the two-dimensional array of discrete masking material portions 177. Alternatively, a hard mask material layer can be formed over the layer stack (30L, 110L, 120L, 134L, 136L, 148L, 150L, 170L) prior to formation of a patterned photoresist material layer thereupon, and the pattern in the patterned photoresist material layer can be transferred through the hard mask material layer to pattern the hard mask material layer into the two-dimensional array of discrete masking material portions 177. In this case, the patterned photoresist material may be removed, for example, by ashing.

The two-dimensional array of discrete masking material portions 177 can be formed as a rectangular array in which each discrete masking material portion 177 is located at lattice sites of a two-dimensional rectangular array. Thus, the two-dimensional array of discrete masking material portions 177 can include rows of discrete masking material portions 177. Discrete masking material portions 177 within each row of discrete masking material portion 177 can be arranged along a first horizontal direction hd1 with a regular pitch, which is herein referred to as a first pitch. The rows within the two-dimensional array of discrete masking material portions 177 are laterally spaced apart along a second horizontal direction hd2 with a regular pitch, which is herein referred to as a second pitch. Further, the two-dimensional array of discrete masking material portions 177 can include columns of discrete masking material portions 177. Discrete masking material portions 177 within each column of discrete masking material portion 177 can be arranged along the second horizontal direction hd2 with a regular pitch, which is the second pitch. The columns within the two-dimensional array of discrete masking material portions 177 are laterally spaced apart along the first horizontal direction hd1 with a regular pitch, which is the first pitch. In one embodiment, the second pitch is larger than the first pitch, such as 20 to 100 percent larger. In one embodiment, the second horizontal direction hd2 can be perpendicular to the first horizontal direction hd1.

In one embodiment, the anisotropic etching is carried out by ion beam etching or milling. In contrast, to reactive ion etching, ion beam etching or milling cause little or no chemical etch damage to the ferromagnetic materials. However, ion beam etching or milling may cause sidewall shunting in deep and narrow openings with a high aspect ratio. Therefore, the termination of the anisotropic etching by ion beam etching or milling on the continuous tunnel barrier layer 134L is advantageous because it reduces the depth and aspect ratio of the openings, which reduces or eliminates the sidewall shunting and shorting.

Each discrete masking material portion 177 within the two-dimensional array of discrete masking material portions 177 can have a same horizontal cross-sectional shape, which may be a circular shape, an elliptical shape, a polygonal shape such as a rectangular shape, or any other curvilinear shape having a closed periphery. The maximum lateral extent of each discrete masking material portion 177 along the first horizontal direction hd1 may be in a range from 20% to 80% of the lesser of the first pitch, and the maximum lateral extent of each discrete masking material portion 177 along the second horizontal direction hd2 may be in a range from 20% to 80% of the lesser of the second pitch. In one embodiment, each of the first pitch and the second pitch can be in a range from 20 nm to 200 nm, although lesser and greater pitches can also be employed.

Figure 5:
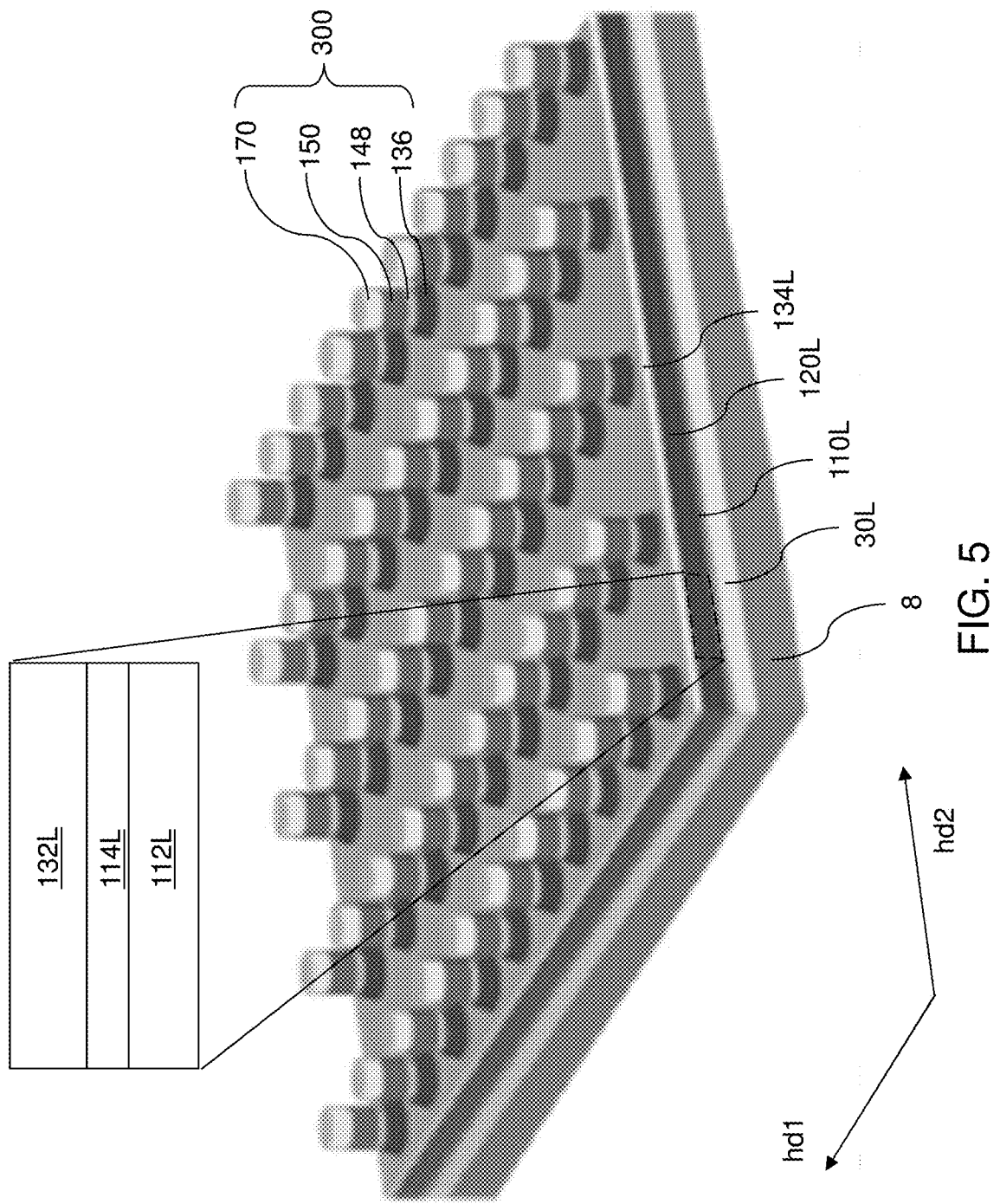
FIG. 5 illustrates a perspective view of the first exemplary structure after formation of a two-dimensional array of pillar structures according to the first embodiment of the present disclosure.

Referring to FIG. 5, the pattern in the two-dimensional array of discrete masking material portions 177 is transferred through a layer stack including the continuous electrically conductive material layer 170L, the continuous selector material layer 150L, the continuous electrically conductive capping layer 148L, and the continuous free magnetization material layer 136L by performing an anisotropic etch process that employs the two-dimensional array of discrete masking material portions 177 as an etch mask. The anisotropic etch process can include multiple etch steps that sequentially etch through unmasked portions of the continuous electrically conductive material layer 170L, the continuous selector material layer 150L, the continuous electrically conductive capping layer 148L, and the continuous free magnetization material layer 136L employing the two-dimensional array of discrete masking material portions 177 as the etch mask. The final step of the anisotropic etch process can employ an etch chemistry that etches the material of the continuous free magnetization material layer 136L and stops on the continuous nonmagnetic tunnel barrier layer 134L. In other words, the etch chemistry of the final step of the anisotropic etch process etches the material of the continuous free magnetization material layer 136L at a much higher etch rate than the material of the continuous nonmagnetic tunnel barrier layer 134L. In one embodiment, the etch rate of the material of the continuous free magnetization material layer 136L can be at least three times, such as more than six times and/or ten times, the etch rate of the material of the continuous nonmagnetic tunnel barrier layer 134L during the final step of the anisotropic etch process.

The two-dimensional array of discrete masking material portions 177 may be consumed during the anisotropic etch process or may be removed after the anisotropic etch process. Remaining portions of the layer stack of the continuous electrically conductive material layer 170L, the continuous selector material layer 150L, the continuous electrically conductive capping layer 148L, and the continuous free magnetization material layer 136L constitute a two-dimensional array of pillar structures 300. Specifically, the continuous electrically conductive material layer 170L can be patterned into a two-dimensional array of electrically conductive material layers 170. The continuous selector material layer 150L can be patterned into a two-dimensional array of selectors 150. The continuous electrically conductive capping layer 148L can be patterned into a two-dimensional array of electrically conductive capping layers 148. The continuous free magnetization material layer 136L can be patterned into a two-dimensional array of free layers 136.

Each pillar structure 300 can include a vertical layer stack including, from bottom to top, a free layer 136, an electrically conductive capping layer 148, a selector 150, and an electrically conductive material layer 170. In one embodiment, all sidewalls within a pillar structure 300 can be vertical or substantially vertical. In one embodiment, each element within a pillar structure 300 can have a same or similar horizontal cross-sectional shape. However, the free layer 136 may have a larger diameter than the electrically conductive capping layer 148, the selector 150, and the electrically conductive material layer 170 due to loading and/or shadowing effects of ion beam etching or milling.

Generally, a two-dimensional array of pillar structures 300 can be formed by patterning a layer stack including at least the continuous free magnetization material layer 136L. Each of the pillar structures 300 comprises a free layer 136 and a selector 150. The two-dimensional array of selectors 150 is located within the two-dimensional array of the pillar structures 300 as a two-dimensional array of discrete selectors, i.e., selectors without direct contact thereamongst.

Figure 6:
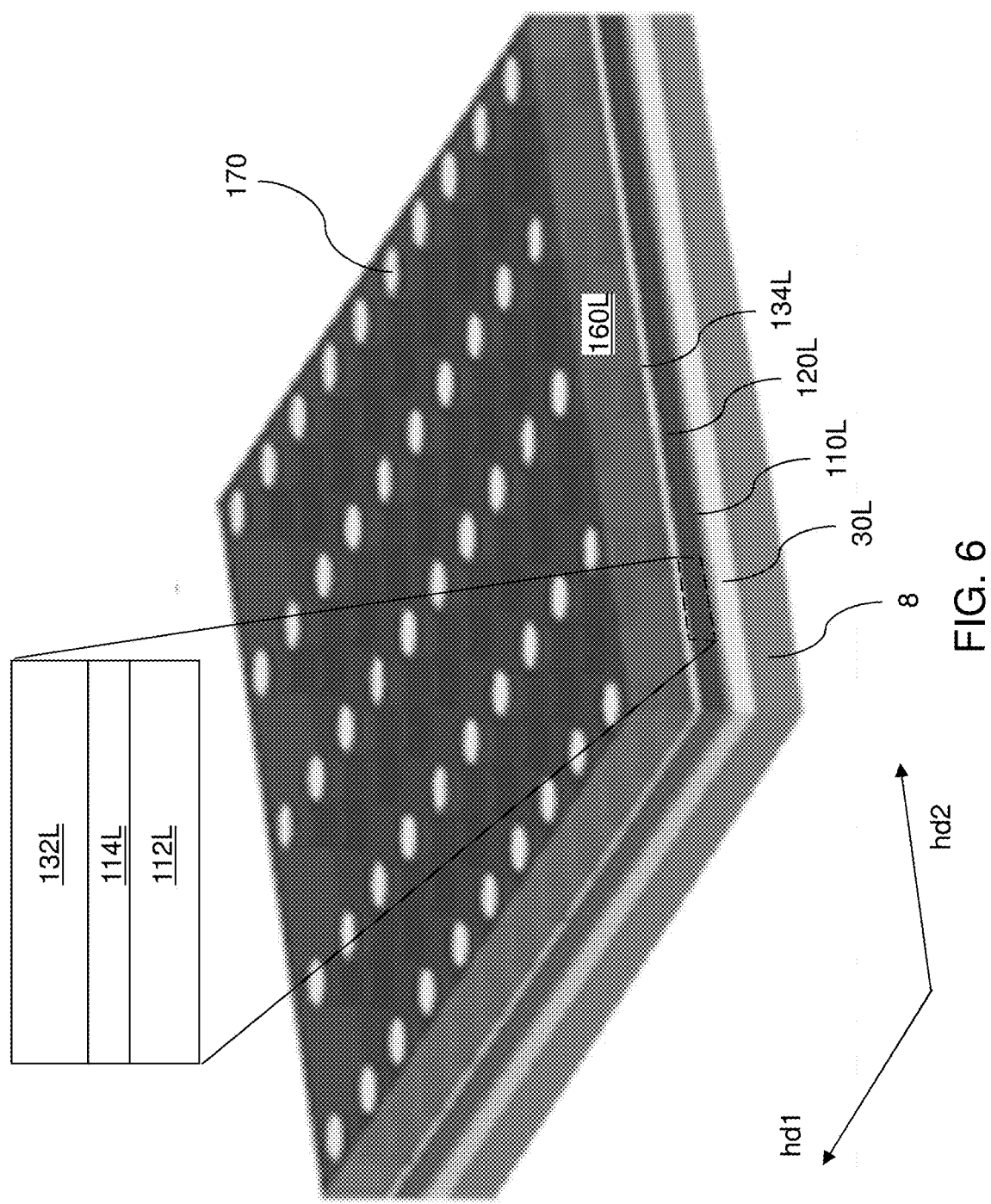
FIG. 6 illustrates a perspective view of the first exemplary structure after formation of a dielectric fill material layer according to the first embodiment of the present disclosure.

Referring to FIG. 6, a dielectric fill material layer 160L can be deposited in the space between the two-dimensional array of pillar structures 300. The dielectric fill material layer 160 includes a dielectric material such as undoped silicate glass (e.g., silicon oxide), a doped silicate glass, organosilicate glass, a spin-on dielectric material such as flowable oxide (FOX), a porous dielectric material. Optionally, a dielectric liner such as a silicon nitride liner and/or a dielectric metal oxide liner may be deposited as a component of the dielectric fill material layer 160L. Portions of the dielectric material of the dielectric fill material layer 160L located above the horizontal plane including the top surfaces of the two-dimensional array of pillar structures 300 can be removed by a planarization process such as a chemical mechanical polishing (CMP) process. In this case, the planarized top surface of the dielectric fill material layer 160L can be within the same horizontal plane as the top surfaces of the two-dimensional array of pillar structures 300.

Figure 7:
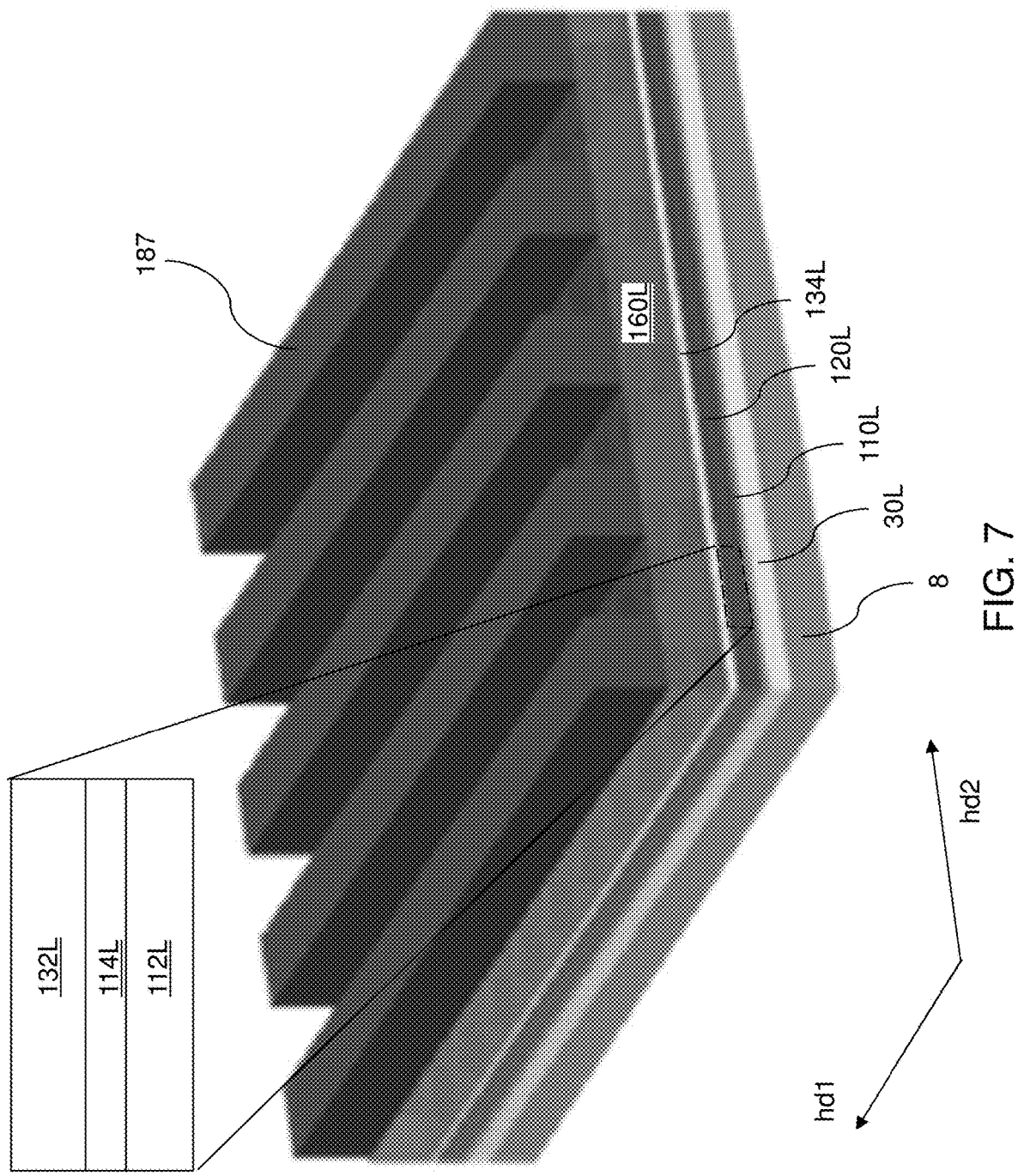
FIG. 7 illustrates a perspective view of the first exemplary structure after formation of a one-dimensional array of line-shaped masking material portions according to the first embodiment of the present disclosure.

Referring to FIG. 7, a one-dimensional array of line-shaped masking material portions 187 can be formed over the two-dimensional array of pillar structures 300 and the dielectric fill material layer 160L. The one-dimensional array of line-shaped masking material portions 187 can be a patterned photoresist layer having a line and space pattern. Each line-shaped masking material portion 187 can laterally extend along the first horizontal direction hd1. The line-shaped masking material portions 187 can overlie a respective row of pillar structures 300, and can be laterally spaced apart from each other along the second horizontal direction hd2 with the second pitch, which is the pitch among the rows of pillar structures 300 along the second horizontal direction hd2. Thus, the line-shaped masking material portions 187 can be arranged as the one-dimensional array of line-shaped masking material portions 187. Each line-shaped masking material portion 187 can have the same width, which can be selected such that the entire area of a respective underlying row of pillar structures 300 is covered by each line-shaped masking material portion 187.

Figure 8:
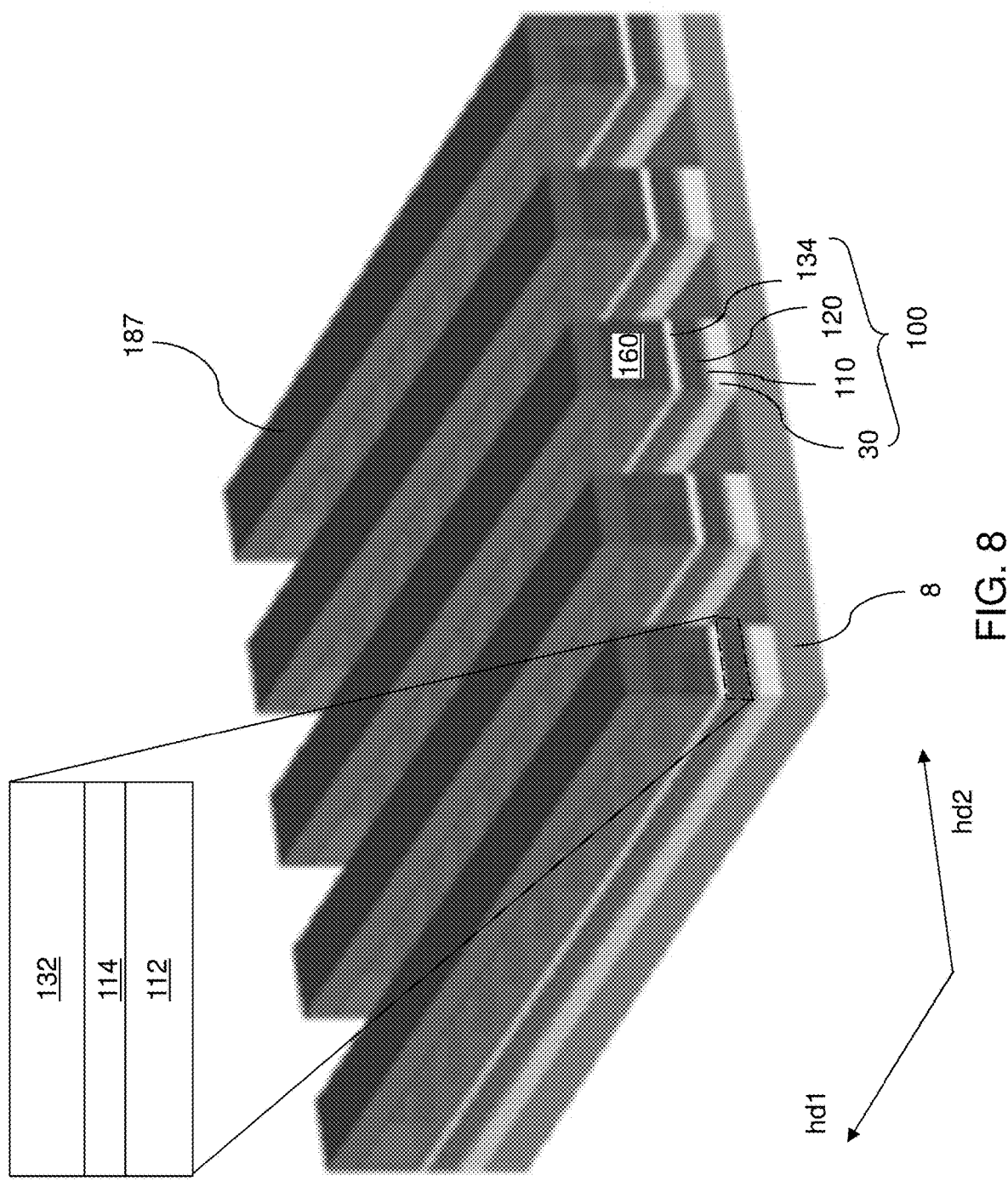
FIG. 8 illustrates a perspective view of the first exemplary structure after formation of first rail structures and dielectric fill material portions according to the first embodiment of the present disclosure.

Referring to FIG. 8, an anisotropic etch process is performed to transfer the pattern in the one-dimensional array of line-shaped masking material portions 187 through the dielectric fill material layer 160L, the continuous nonmagnetic tunnel barrier layer 134L, the continuous synthetic antiferromagnetic (SAF) layer stack 120L (or combination of continuous reference layer 132L and an antiferromagnetic layer), the continuous metallic seed layer 110L, and the first continuous electrically conductive layer 30L. The line-shaped masking material portions 187 are employed as an etch mask during the anisotropic etch process. The layer stack of the continuous nonmagnetic tunnel barrier layer 134L, the continuous synthetic antiferromagnetic (SAF) layer stack 120L (or combination of continuous reference layer 132L and an antiferromagnetic layer), the continuous metallic seed layer 110L, and the first continuous electrically conductive layer 30L is divided into first rail structures 100 that laterally extend along the first horizontal direction hd1 and are laterally spaced apart by line trenches along the second horizontal direction hd2. Each first rail structure 100 includes a vertical stack including, from bottom to top, a first electrically conductive line 30, a metallic seed layer 110, a SAF structure 120 (or combination of reference layer 132L and an antiferromagnetic layer), and a tunnel barrier layer 134. Each first electrically conductive line 30 is a patterned portion of the first continuous electrically conductive layer 30L. Each metallic seed layer 110 is a patterned portion of the continuous metallic seed layer 110L. Each SAF structure 120 is a patterned portion of the continuous synthetic antiferromagnetic (SAF) layer stack 120L. Each tunnel barrier layer 134 is a patterned portion of the continuous nonmagnetic tunnel barrier layer 134L. In one embodiment, the bottom half of a bottom-pinned MRAM film stack (elements 30, 110, 120 and 134) is patterned into first rail structures (e.g., bottom metal lines) 100 with a slightly relaxed pitch in the second horizontal direction hd2, while the free layer 136 and the capping layer 148 are patterned into bit arrays with a much tighter pitch in the first horizontal direction hd1. The slightly relaxed pitch increases the width of the rail shaped trenches between the first rail structures 100 and reduces or eliminates the shunting and short circuits between adjacent first rail structures 100.

The dielectric fill material layer 160L is patterned into a plurality of rail shaped dielectric matrices 160 that laterally extend along the first horizontal direction hd1. Each dielectric matrix 160 laterally surrounds a respective row of pillar structures 300. Each dielectric matrix 160 can have a uniform width that is invariant with translation along the first horizontal direction hd1. Each dielectric matrix 160 can have the same width along the second horizontal direction hd1 that is the same as the width of a respective underlying first rail structure 100. Each vertically stacked pair of a first rail structure 100 and a dielectric matrix 160 can have vertically coincident sidewalls that laterally extend along the first horizontal direction hd1. As used herein, a first surface and a second surface are "vertically coincident" if the second surface overlies or underlies the first surface and a vertical plane including the first surface and the second surface exists. The one-dimensional array of line-shaped masking material portions 187 can be removed after the anisotropic etch process, for example, by ashing.

Figure 9:
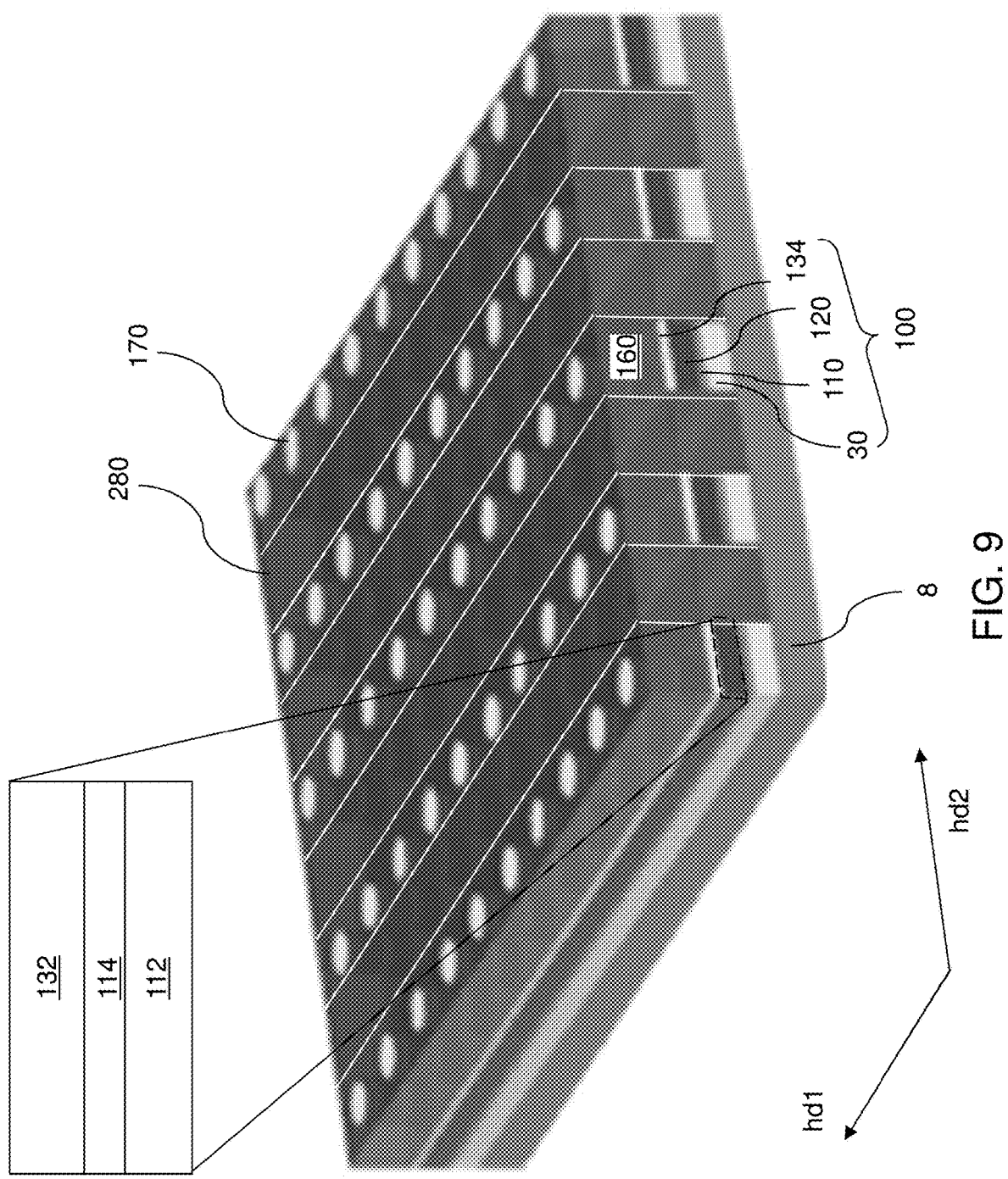
FIG. 9 illustrates a perspective view of the first exemplary structure after formation of dielectric rail structures according to the first embodiment of the present disclosure.

Referring to FIG. 9, at least one dielectric material such as undoped silicate glass (e.g., silicon oxide), a doped silicate glass, organosilicate glass, and/or a flowable oxide material can be deposited in the line trenches between neighboring pairs of first rail structures 100. Optionally, a dielectric liner (such as a silicon nitride liner and/or a dielectric metal oxide liner) can be deposited on the sidewalls of the line trenches. The at least one dielectric material (and the optional dielectric liner) can be removed from above the horizontal plane including the top surfaces of the pillar structures 300 and the dielectric matrices 160 by a planarization process such as a chemical mechanical polishing (CMP) process. Remaining portions of the at least one dielectric material located within a respective line trench constitute dielectric rail structures 280. Each dielectric rail structure 280 may contact a top surface of the substrate 8, and may have a top surface located within a same horizontal plane as the top surfaces of the pillar structures 300 and the dielectric matrices 160. A dielectric rail structure 280 can contact a pair of first rail structures 100 and a pair of dielectric matrices 160. The dielectric rail structures 280 include dielectric material portions that are formed between neighboring pairs of the first rail structures 100.

Figure 10:
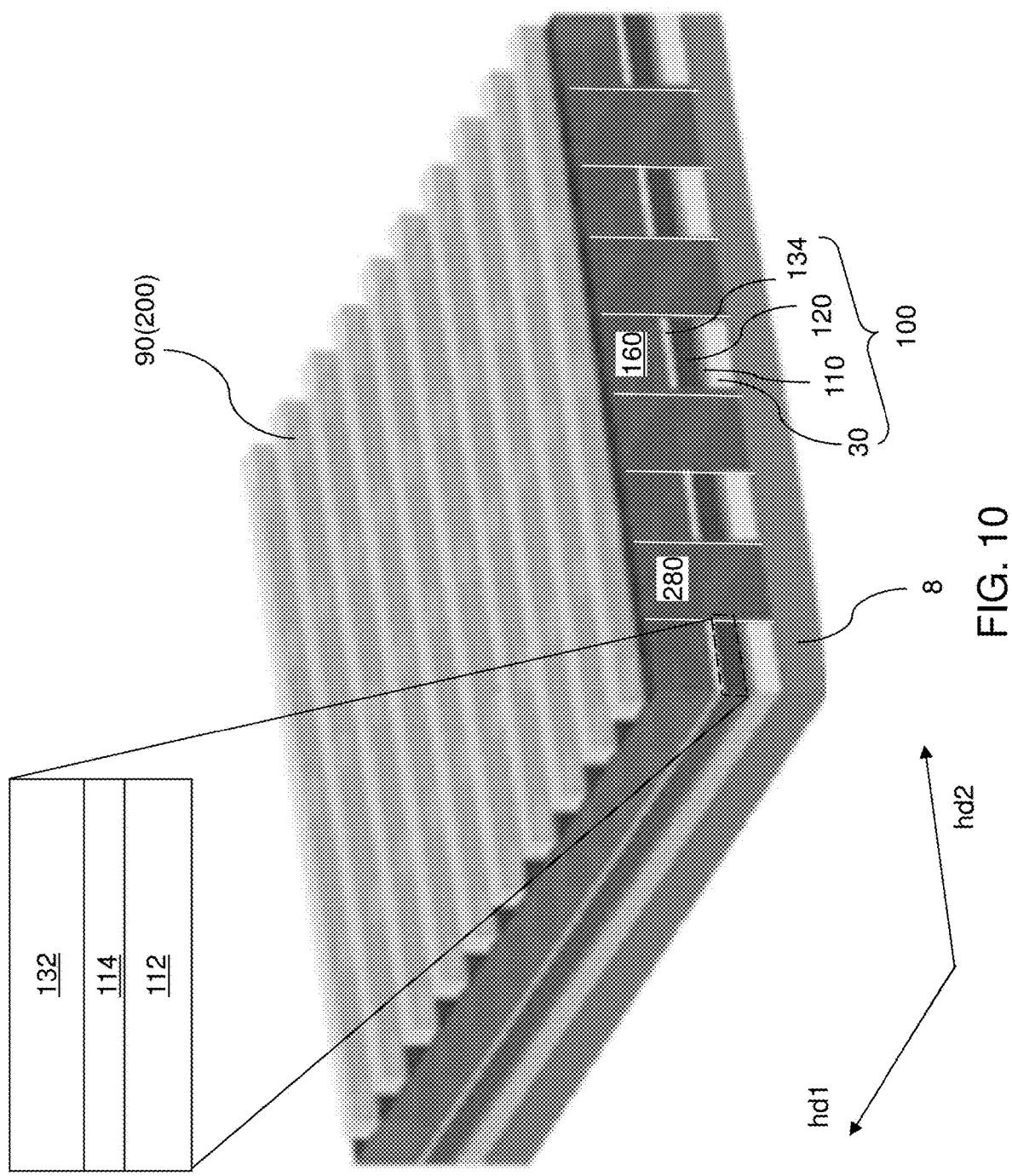
FIG. 10 illustrates a perspective view of the first exemplary structure after formation of second electrically conductive lines according to the first embodiment of the present disclosure.

Referring to FIG. 10, at least one metallic material layer can be deposited on the top surfaces of the two-dimensional array of pillar structures 300, the dielectric matrices 160, and the dielectric rail structures 280. The at least one metallic material layer includes a second nonmagnetic electrically conductive material such as Cu, W, Co, Mo, Ti, Ta, TiN, TaN, WN, or combinations thereof. The thickness of the at least one metallic material layer can be in a range from 20 nm to 100 nm, although lesser and greater thicknesses can also be employed.

The at least one metallic material layer can be patterned into line structures that extend in the second horizontal direction hd2 and contact top surfaces of a respective column of pillar structures 300. Each patterned portion of the at least one metallic material layer constitutes a second electrically conductive line (e.g., bit line) 90. Second rail structures 200 are formed over the two-dimensional array of pillar structures 300, the dielectric matrices 160, and the dielectric rail structures 280. Each second rail structure 200 can consist of a second electrically conductive line 90. Each second rail structure 200 is formed on top surfaces of a respective column of pillar structures 300 of the two-dimensional array of pillar structures 300.

Figure 11A:
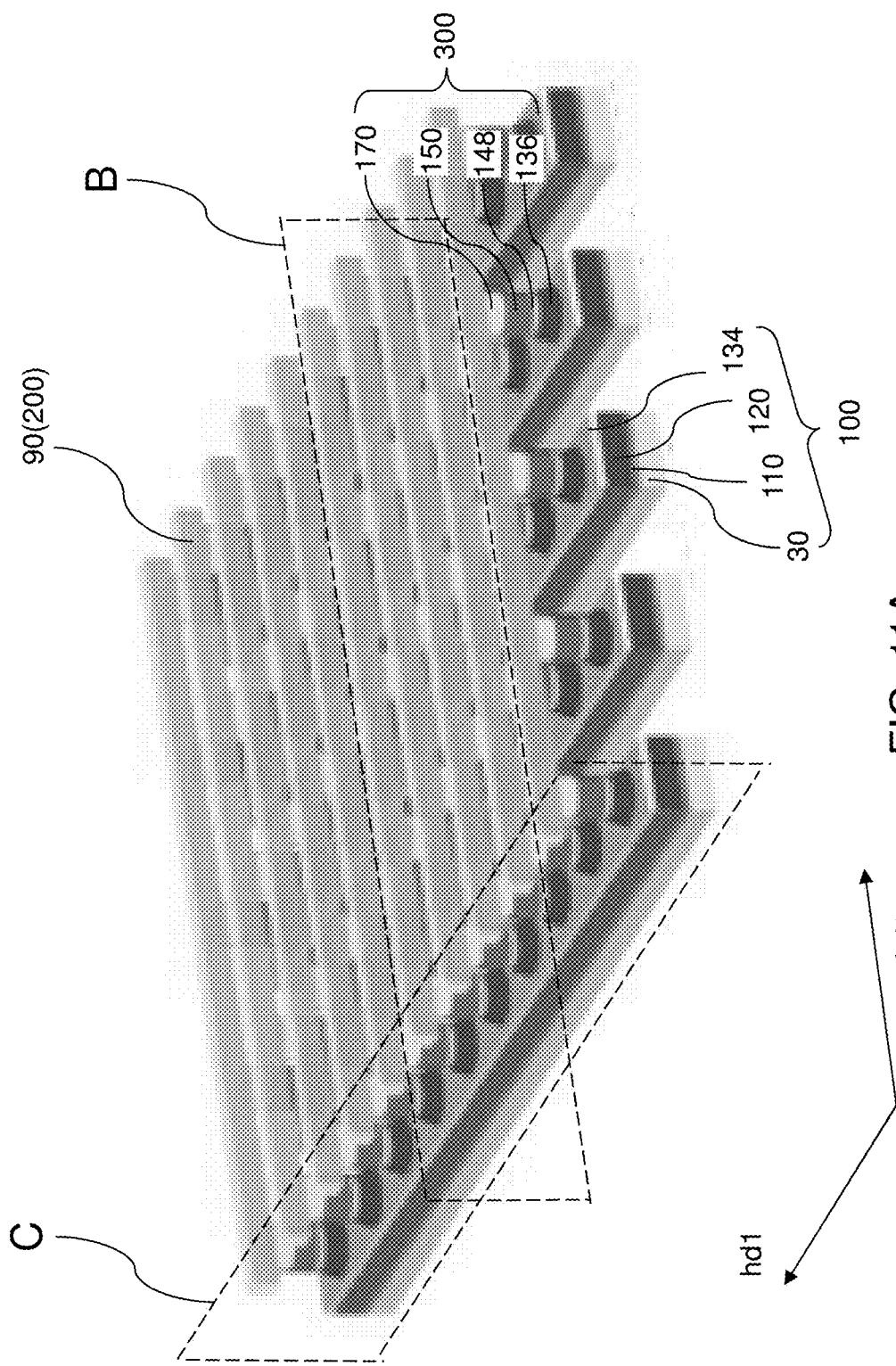
FIG. 11A illustrates a see-through perspective view of the first exemplary structure of FIG. 10 in which dielectric material portions are not illustrated.

Referring to FIGS. 11A-11C, the first exemplary structure of FIG. 12 is illustrated without dielectric material portions (160, 180) and without the substrate 8 for the purpose of clarity. FIGS. 11D-11F are top-down view of various configurations of the first exemplary structure that employ different geometrical relationship between a pillar structure 300, an underlying first rail structure 100, and an overlying second rail structure 200.

In one embodiment, a pillar structure 300 may have a segment of a sidewall that is not vertically coincident with any sidewall of the first rail structure 100 or with any sidewall of the second rail structures 200. In one embodiment, the entire sidewall of a pillar structure 300 may not overlap with any sidewall of an underlying first rail structure 100 and may not overlap with any sidewall of an overlying second rail structure 200 as illustrated in FIG. 11D. In one embodiment, a sidewall of a pillar structure 300 may intersect two sidewalls of an overlying second rail structure 200 as illustrated in FIG. 11E. In one embodiment, a sidewall of a pillar structure 300 may intersect a first sidewall of an overlying second rail structure 200 and does not intersect a second sidewall of the overlying second rail structure 200 that is parallel to the first sidewall as illustrated in FIG. 11F. Generally, variations in the lateral offset distance LOD between a sidewall of a pillar structure 300 and an overlying second rail structure 200 can provide various overlap configurations between the pillar structure 300 and the overlying second rail structure 200.

In one embodiment, the two-dimensional array of pillar structures 300 can have a sidewall segment that is not parallel to the first horizontal direction hd1 and is not parallel to the second horizontal direction hd2. As used herein, a sidewall segment refers to a segment of a sidewall that has a finite size. Such a sidewall segment may be a curved segment or a straight segment having a tangential vertical plane that extends horizontally along a horizontal direction that does not coincide with the first horizontal direction hd1 or with the second horizontal direction hd2.

In one embodiment, each pillar structure 300 within the two-dimensional array of pillar structures 300 has a lateral extent along the second horizontal direction hd2 that is less than a width of a respective underlying one of the first rail structures 100 along the second horizontal direction hd2 as illustrated in FIGS. 11D, 11E, and 11F.

Figure 12A:
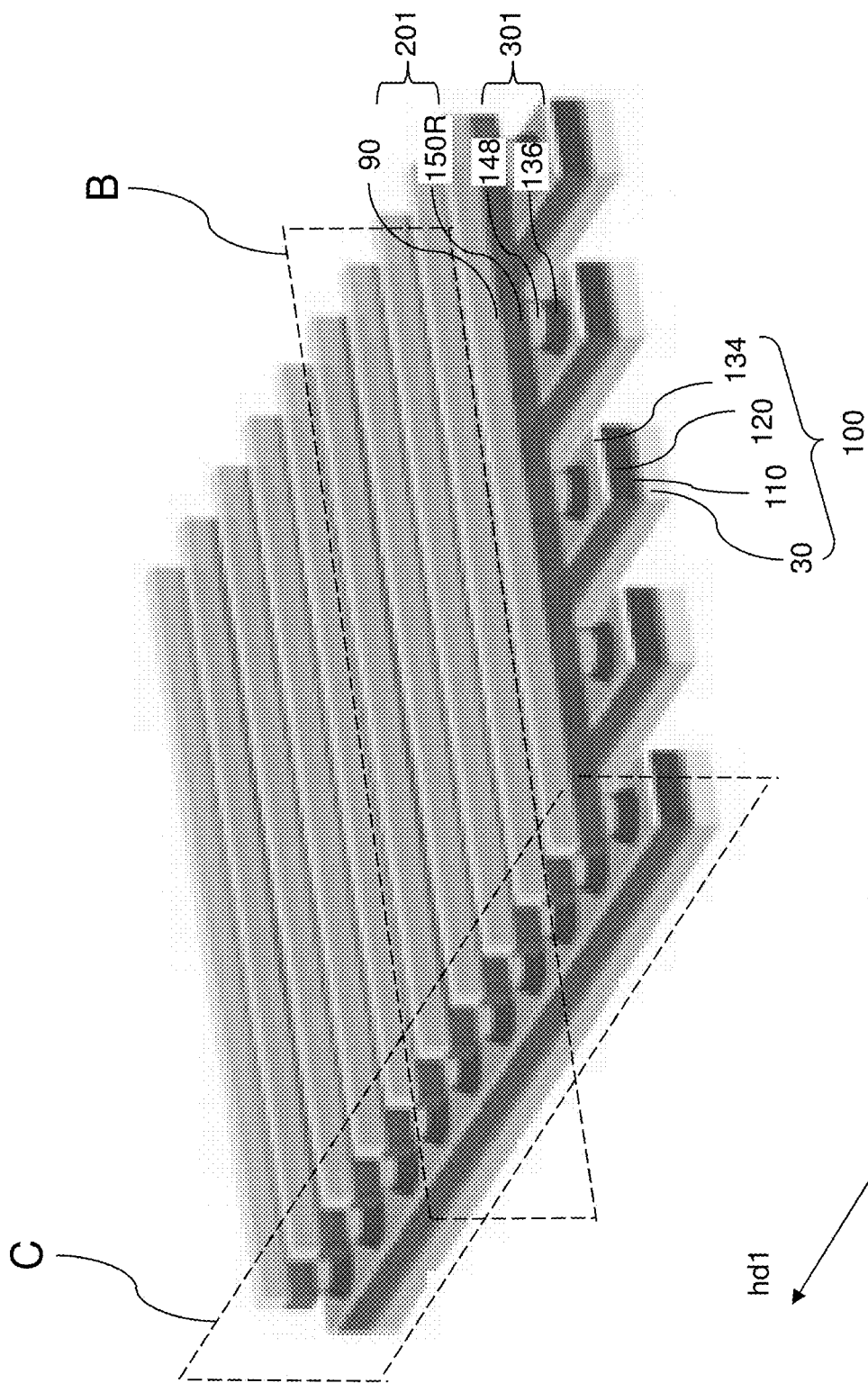
FIG. 12A illustrates a see-through perspective view of an alternative embodiment of the first exemplary structure according to the first embodiment of the present disclosure.
Figure 12B:
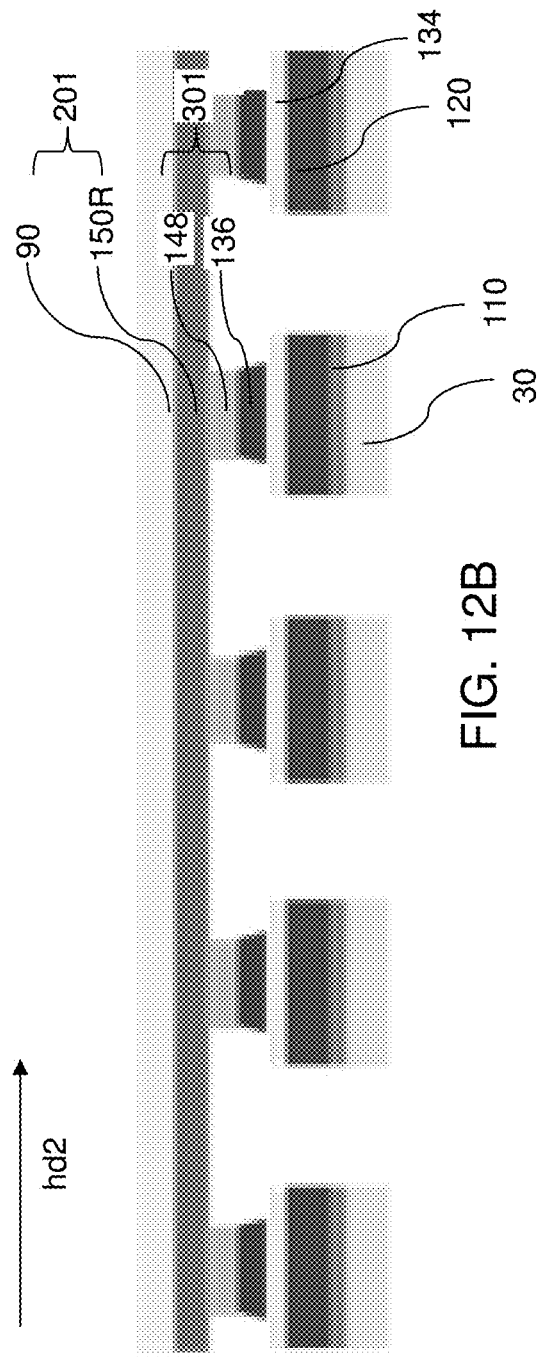
FIG. 12B is a vertical cross-sectional view along the vertical plane B-B' of FIG. 12A.
Figure 12C:
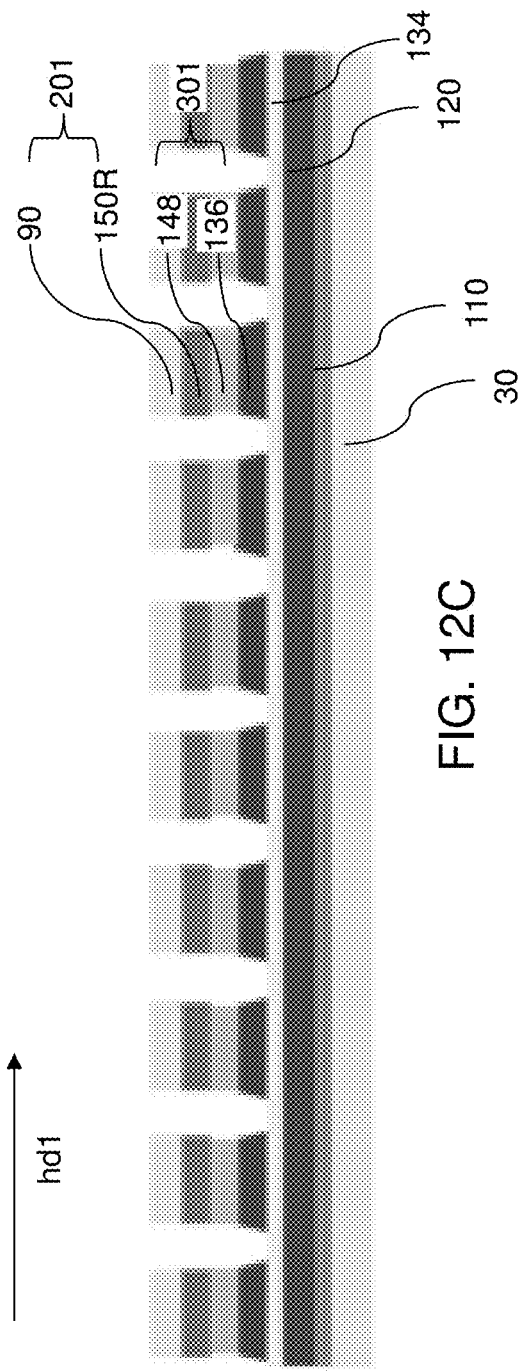
FIG. 12C is a vertical cross-sectional view along the vertical plane C-C' of FIG. 12A.

Referring to FIGS. 12A-12C, an alternative embodiment of the first exemplary structure according to the first embodiment of the present disclosure is illustrated. In this alternative embodiment, the selectors 150 are rail shaped and are located in the second rail structures, rather than being located in the pillar structures. The dielectric material portions (160, 180) and the substrate 8 are omitted in FIGS. 12A-12C in the same manner as in FIGS. 11A-11C for the purpose of clarity. The alternative embodiment of the first exemplary structure can be derived from the first exemplary structure illustrated in FIGS. 10 and 11A-11E by modifying the sequence of processing steps for formation of the first exemplary structure. The processing steps of FIG. 3 can be modified to form a layer stack including, from bottom to top, a first continuous electrically conductive layer 30L, a continuous metallic seed layer 110L, a continuous synthetic antiferromagnetic (SAF) layer stack 120L (or a continuous reference layer 132L located over a continuous antiferromagnetic layer), a continuous nonmagnetic tunnel barrier layer 134L, a continuous free magnetization material layer 136L, and a continuous electrically conductive capping layer 148L. In other words, a continuous selector material layer 150L and a continuous electrically conductive material layer 170L are not formed at processing steps corresponding to the processing steps of FIG. 3. The continuous electrically conductive capping layer 148L and the continuous free magnetization material layer 136L are patterned at processing steps that correspond to the processing steps of FIG. 5 to form a two-dimensional array of pillar structures 301. Each pillar structure 301 can include, and can consist of, a vertical stack of a free layer 136 and an electrically conductive capping layer 148.

Dielectric matrices 160 and dielectric rail structures 280 can be formed in the manner described above. Top surfaces of the dielectric matrices 160 and the dielectric rail structures 280 can be coplanar with top surfaces of the two-dimensional array of pillar structures 301. A continuous selector material layer 150L and a continuous electrically conductive material layer 170L can be deposited over the two-dimensional array of pillar structures 301, the dielectric matrices 160, and the dielectric rail structures 280, and can be patterned into line structures that can have the same horizontal cross-sectional shapes as the second electrically conductive lines 90 that are described above. Each patterned portion of the continuous selector material layer 150L constitutes a selector rail structure 150R, and each patterned portion of the continuous electrically conductive material layer 170L constitutes a second electrically conductive line 90. Each vertical stack of a selector rail structure 150R and a second electrically conductive line 90 constitutes a second rail structure 201.

In the alternative embodiment illustrated in FIGS. 12A-12C, the continuous selector material layer 150L is patterned into the selector material rails 150R by an anisotropic etch process that employs a one-dimensional array of line-shaped masking material portions 187 as an etch mask. Each selector rail structure 150R is a line structure including a selector material and having a shape of an elongated line that extends along the second horizontal direction hd2. Specifically, each of the selector material rails 150R can include a respective column of selectors and contacts a respective underlying column of pillar structures 301 within the two-dimensional array of pillar structures 301. In this embodiment, no electrode material should be located below the ovonic threshold material of the selector material rails 150R. In one embodiment, each of the pillar structures 301 can comprise an electrically conductive capping layer 148 located between a respective one of the free layers 136 and a respective one of the selector material rails 150R. Generally, a two-dimensional array of selectors may be located within the two-dimensional array of the pillar structures 300 as shown in FIGS. 11A-11F or within the second rail structures 201 as shown in FIGS. 12A-12C.

Figure 13:
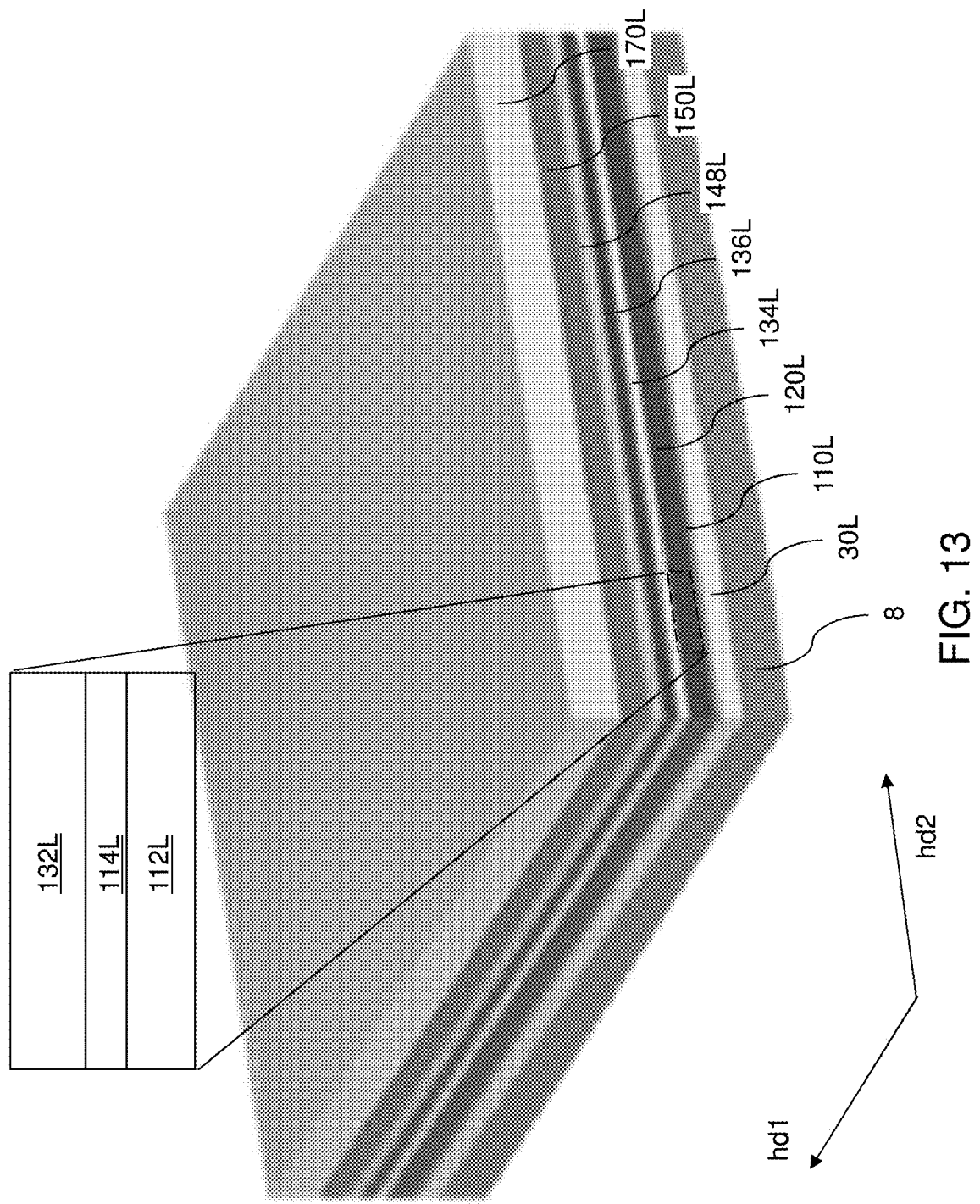
FIG. 13 illustrates a perspective view of a second exemplary structure after formation of a layer stack comprising a second continuous electrically conductive layer, a continuous reference layer, a continuous nonmagnetic tunnel barrier layer, and a continuous free magnetization material layer over a substrate according to a second embodiment of the present disclosure.

In a second embodiment, two rail shaped masks are used to pattern the rail structures and pillar structures instead of the discrete masking material portions 177 of the first embodiment. This results in rectangular pillar structures 300. Referring to FIG. 13, the second exemplary structure according to a second embodiment of the present disclosure is illustrated, which can be the same as the first exemplary structure illustrated in FIG. 3 above.

Figure 14:
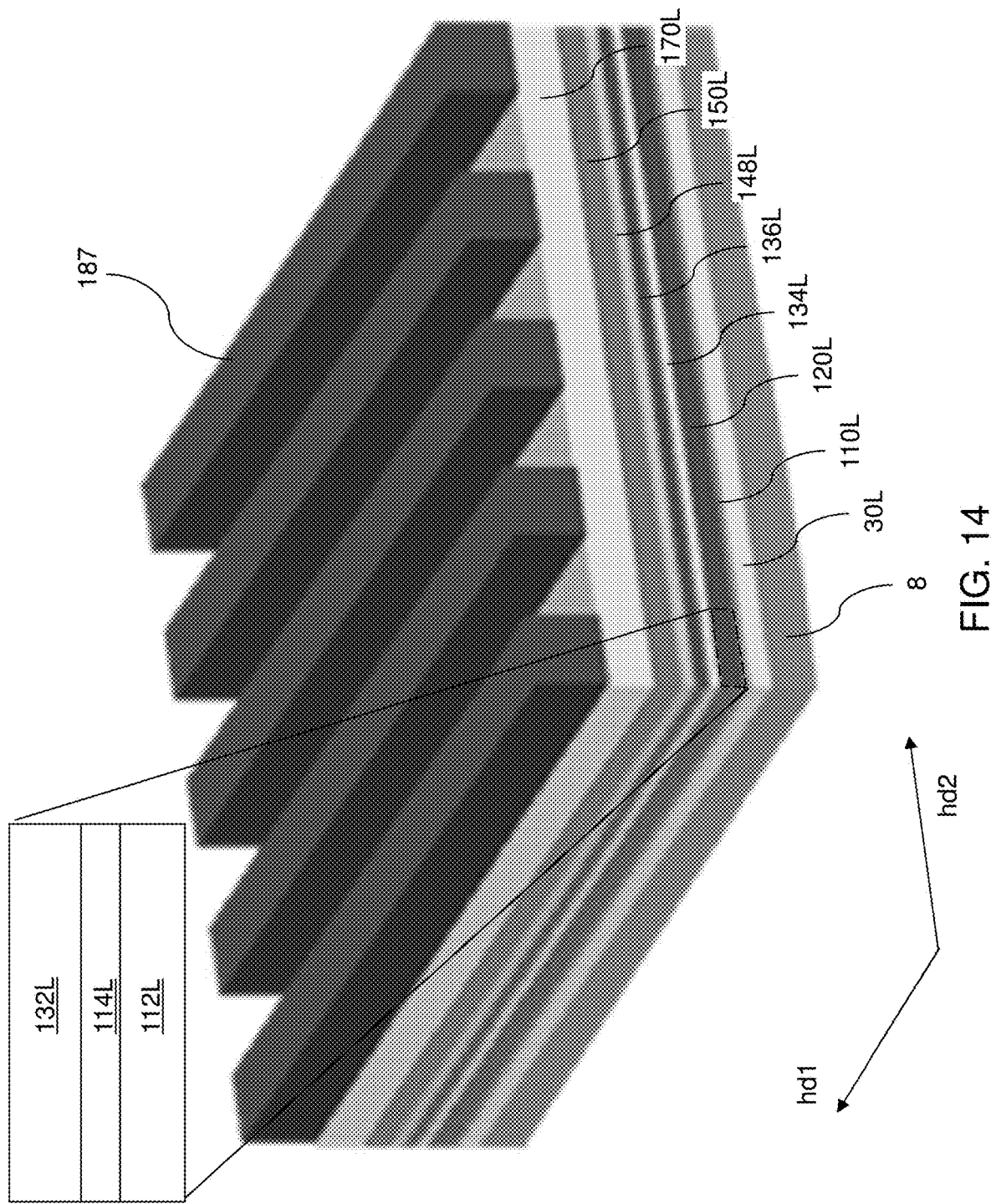
FIG. 14 illustrates a perspective view of the second exemplary structure after formation of a first one-dimensional array of line-shaped masking material portions according to the second embodiment of the present disclosure.

Referring to FIG. 14, a first one-dimensional array of line-shaped masking material portions 187 can be formed over the continuous electrically conductive material layer 170L. The first one-dimensional array of line-shaped masking material portions 187 can include the same material as in the first embodiment, and can have the same pattern as in the first embodiment. Thus, each line-shaped masking material portion 187 can laterally extend along the first horizontal direction hd1. The line-shaped masking material portions 187 can be laterally spaced apart from each other along the second horizontal direction hd2 with a uniform pitch, which is herein referred to as a second pitch. The line-shaped masking material portions 187 can have the same width, and can be laterally spaced from each other with a same spacing. The sum of the width and the spacing is equal to the second pitch. Thus, the line-shaped masking material portions 187 can be arranged as the first one-dimensional array of line-shaped masking material portions 187.

Figure 15:
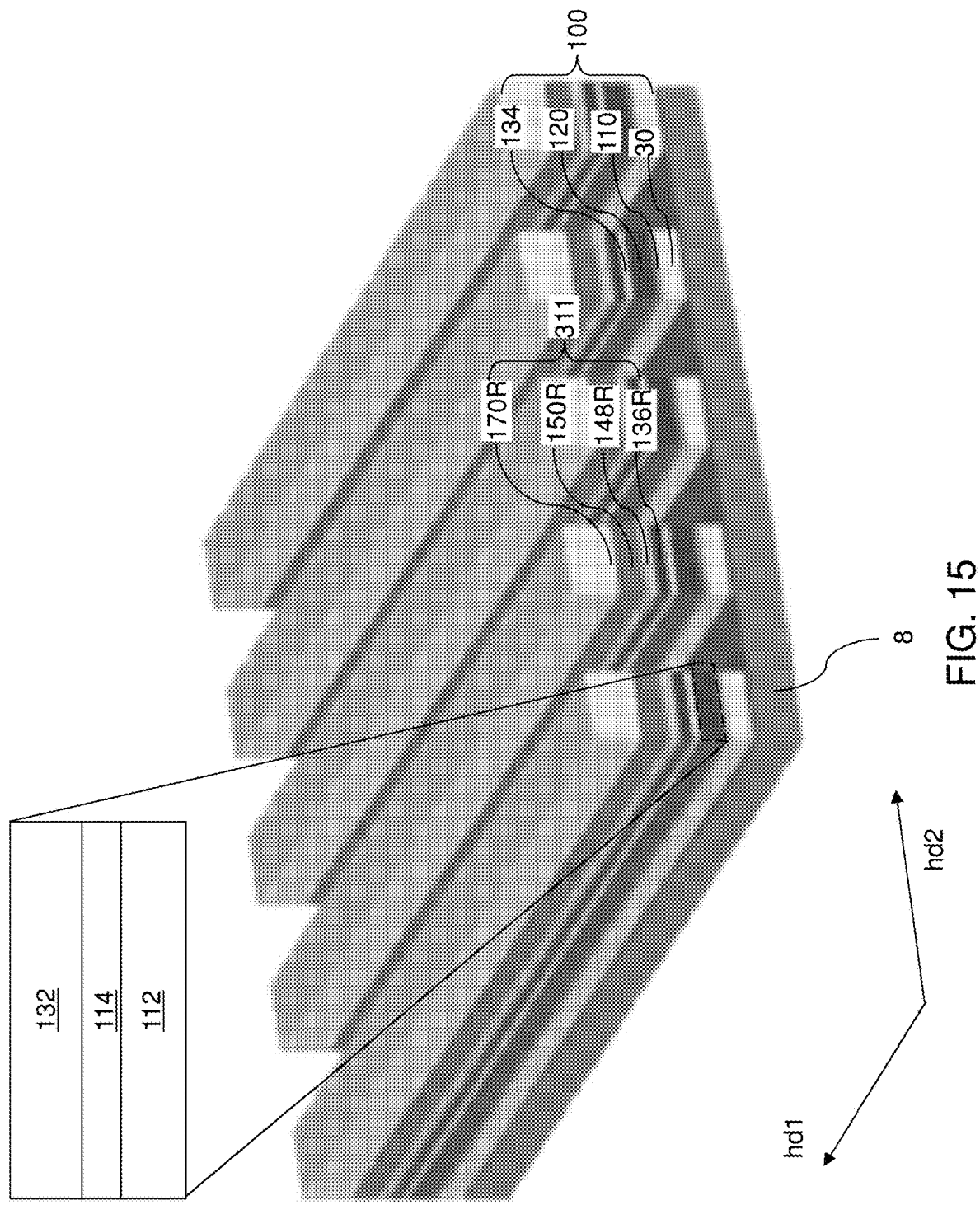
FIG. 15 illustrates a perspective view of the second exemplary structure after formation of first rail structures and in-process rail structures according to the second embodiment of the present disclosure.

Referring to FIG. 15, a first anisotropic etch process is performed to transfer the pattern in the one-dimensional array of line-shaped masking material portions 187 through the continuous electrically conductive material layer 170L, the continuous selector material layer 150L, the continuous electrically conductive capping layer 148L, the continuous free magnetization material layer 136L, the continuous nonmagnetic tunnel barrier layer 134L, the continuous synthetic antiferromagnetic (SAF) layer stack 120L (or a continuous reference layer 132 located over an antiferromagnetic layer), the continuous metallic seed layer 110L, and the first continuous electrically conductive layer 30L. The layer stack of the continuous electrically conductive material layer 170L, the continuous selector material layer 150L, the continuous electrically conductive capping layer 148L, and the continuous free magnetization material layer 136L is divided into in-process rail structures 311 that laterally extend along the first horizontal direction hd1 and are laterally spaced apart by line trenches along the second horizontal direction hd2. The in-process rail structures 311 are intermediate structures that are subsequently modified to form pillar structures. The layer stack of the continuous nonmagnetic tunnel barrier layer 134L, the continuous synthetic antiferromagnetic (SAF) layer stack 120L, the continuous metallic seed layer 110L, and the first continuous electrically conductive layer 30L is divided into the first rail structures 100 that laterally extend along the first horizontal direction hd1 and are laterally spaced apart by line trenches along the second horizontal direction hd2.

Each in-process rail structure 311 includes a vertical stack including, from bottom to top, a free magnetization material rail 136R, an electrically conductive capping rail 148R, a selector rail structure 150R, an electrically conductive material rail 170R. Each patterned portion of the continuous free magnetization material layer 136L constitutes a free magnetization material rail 136R. Each patterned portion of the continuous electrically conductive capping layer 148L constitutes an electrically conductive capping layer 148. Each patterned portion of the continuous selector material layer 150L constitutes a selector rail structure 150R. Each patterned portion of the continuous electrically conductive material layer 170L constitutes an electrically conductive material rail 170R.

Each first rail structure 100 includes a vertical stack including, from bottom to top, a first electrically conductive line 30, a metallic seed layer 110, a SAF structure 120 (or the reference layer 132 located over the antiferromagnetic layer), and a tunnel barrier layer 134. Each first electrically conductive line 30 is a patterned portion of the first continuous electrically conductive layer 30L. Each metallic seed layer 110 is a patterned portion of the continuous metallic seed layer 110L. Each SAF structure 120 is a patterned portion of the continuous synthetic antiferromagnetic (SAF) layer stack 120L. Each tunnel barrier layer 134 is a patterned portion of the continuous nonmagnetic tunnel barrier layer 134L. Each first rail structure 100 can have sidewalls that laterally extend along the first horizontal direction hd1 and are vertically coincident with a respective sidewall of an overlying in-process rail structure 311. The first one-dimensional array of line-shaped masking material portions 187 can be removed after the anisotropic etch process, for example, by ashing.

Figure 16:
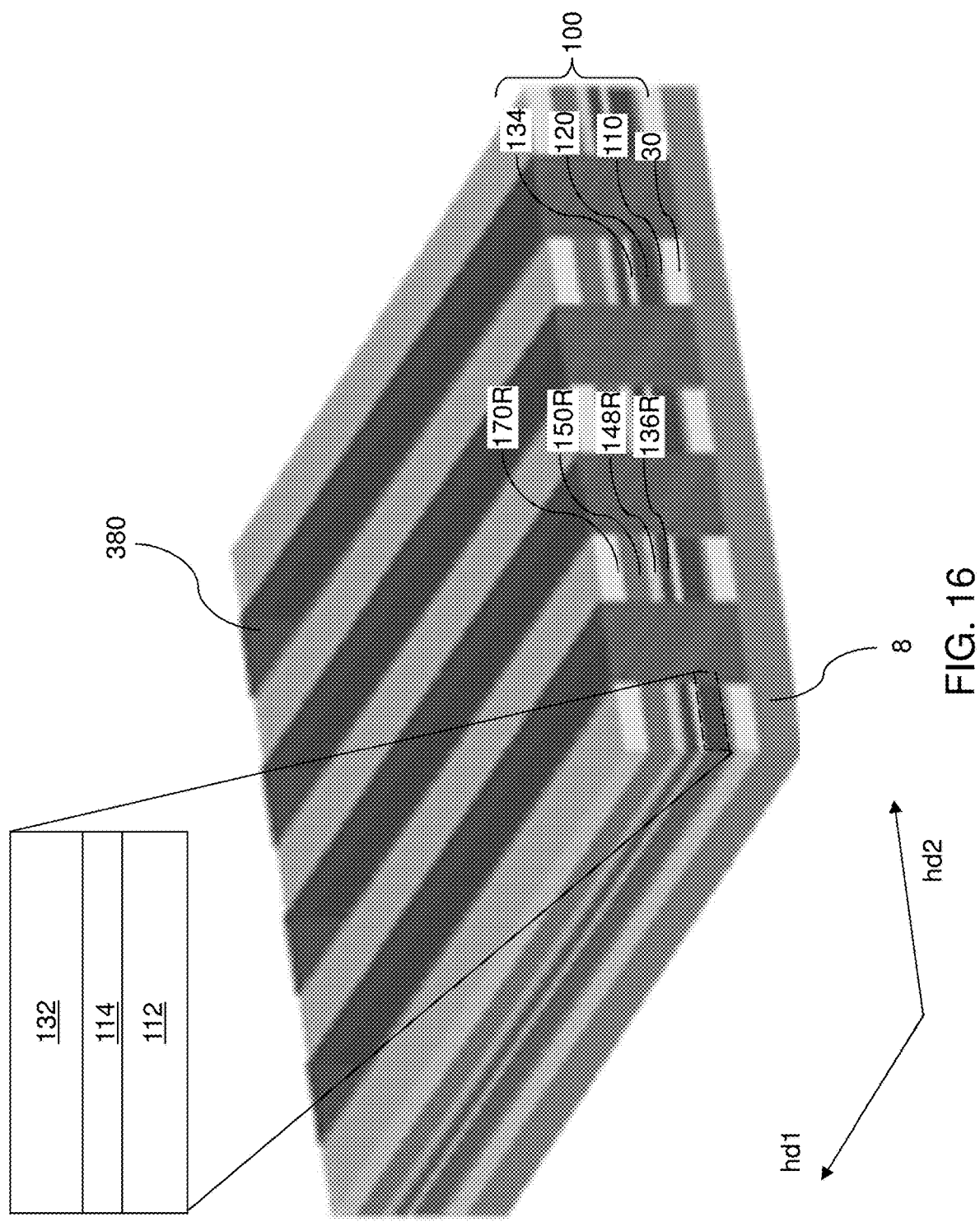
FIG. 16 illustrates a perspective view of the second exemplary structure after formation of dielectric rail structures according to the second embodiment of the present disclosure.

Referring to FIG. 16, at least one dielectric material such as undoped silicate glass, a doped silicate glass, organosilicate glass, and/or a flowable oxide material can be deposited in the line trenches between neighboring pairs of stacks of a first rail structure 100 and an in-process rail structure 311. Optionally, a dielectric liner (such as a silicon nitride liner and/or a dielectric metal oxide liner) can be deposited on the sidewalls of the line trenches. The at least one dielectric material (and the optional dielectric liner) can be removed from above the horizontal plane including the top surfaces of the electrically conductive material rails 170R by a planarization process such as a chemical mechanical polishing (CMP) process. Remaining portions of the at least one dielectric material located within a respective line trench constitute in-process dielectric rail structures 380. Each in-process dielectric rail structure 380 may contact a top surface of the substrate 8, and may have a top surface located within a same horizontal plane as the top surfaces of the electrically conductive material rails 170R. An in-process dielectric rail structure 380 can contact a pair of first rail structures 100 and a pair of in-process rail structures 311. The in-process dielectric rail structures 380 include dielectric material portions that are formed between neighboring pairs of the first rail structures 100.

Figure 17:
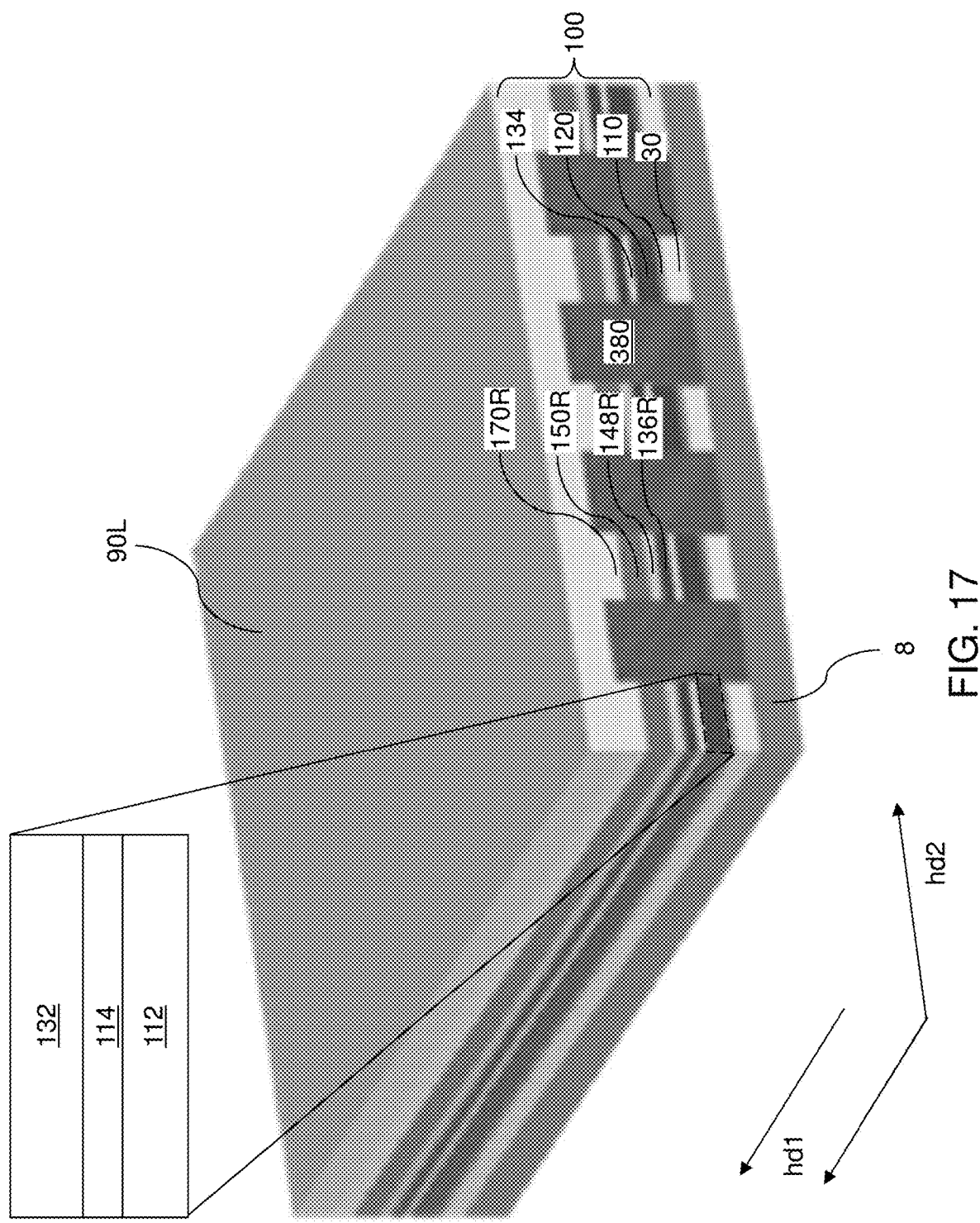
FIG. 17 illustrates a perspective view of the second exemplary structure after formation of a second continuous electrically conductive layer according to the second embodiment of the present disclosure.

Referring to FIG. 17, a second continuous electrically conductive layer 90L can be formed on the top surfaces of the in-process rail structures 311 and the in-process dielectric rail structures 380. The second continuous electrically conductive layer 90L includes a second nonmagnetic electrically conductive material such as Cu, W, Co, Mo, Ti, Ta, TiN, TaN, WN, or combinations thereof. The thickness of the second continuous electrically conductive layer 90L can be in a range from 20 nm to 100 nm, although lesser and greater thicknesses can also be employed.

Figure 18:
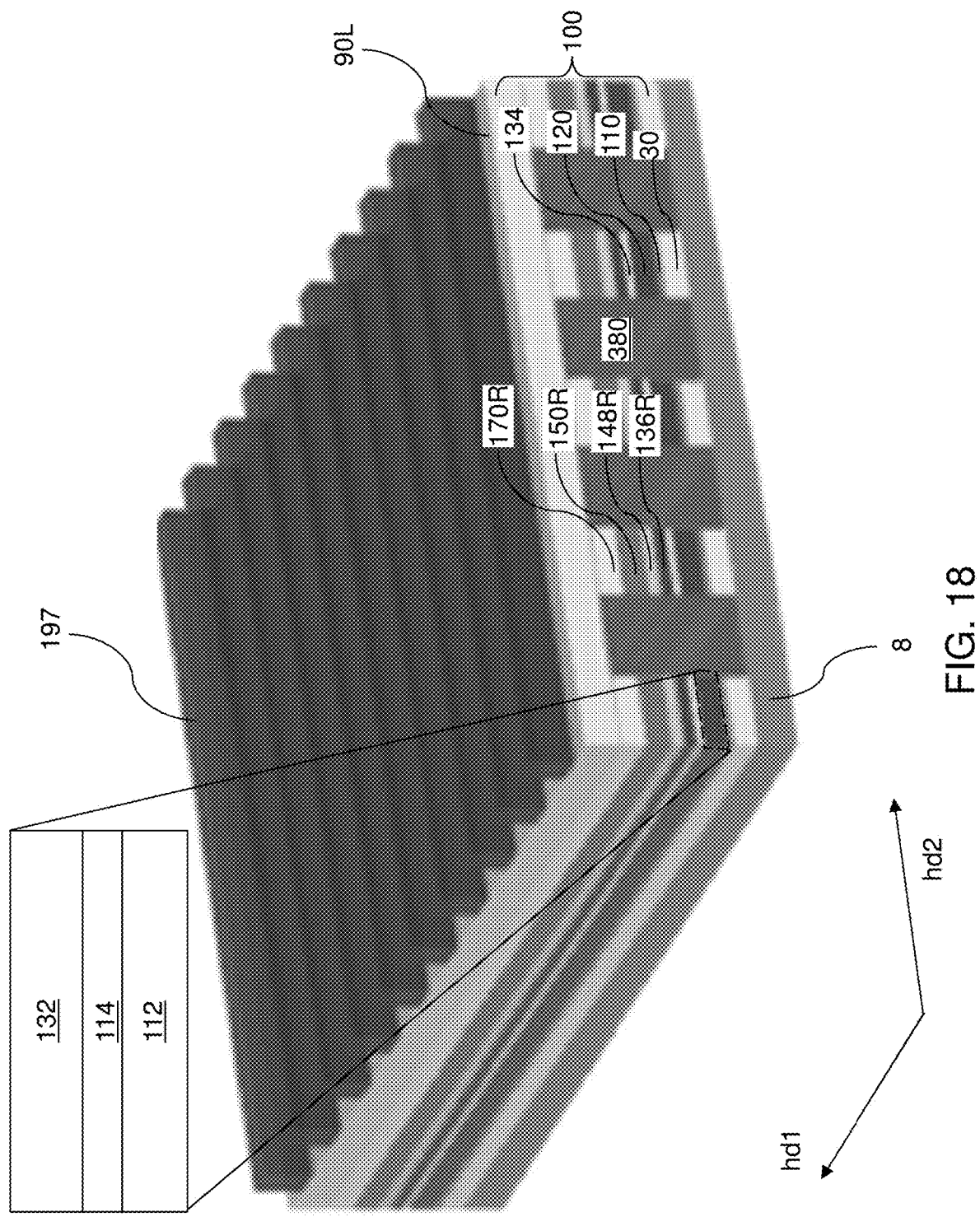
FIG. 18 illustrates a perspective view of the second exemplary structure after formation of a second one-dimensional array of line-shaped masking material portions according to the second embodiment of the present disclosure.

Referring to FIG. 18, a second one-dimensional array of line-shaped masking material portions 197 can be formed over the second continuous electrically conductive layer 90L. The second one-dimensional array of line-shaped masking material portions 187 can be a patterned photoresist layer having a line and space pattern. Each line-shaped masking material portion 197 can laterally extend along the second horizontal direction hd2. The line-shaped masking material portions 197 can be laterally spaced apart from each other along the first horizontal direction hd1 with a uniform pitch, which is herein referred to as a first pitch. The first pitch is the pitch among the rows of pillar structures to be subsequently formed along the first horizontal direction hd1. The line-shaped masking material portions 197 can have the same width, and can be laterally spaced from each other with a same spacing. The sum of the width and the spacing is equal to the first pitch. Thus, the line-shaped masking material portions 197 can be arranged as the second one-dimensional array of line-shaped masking material portions 197.

Figure 19:
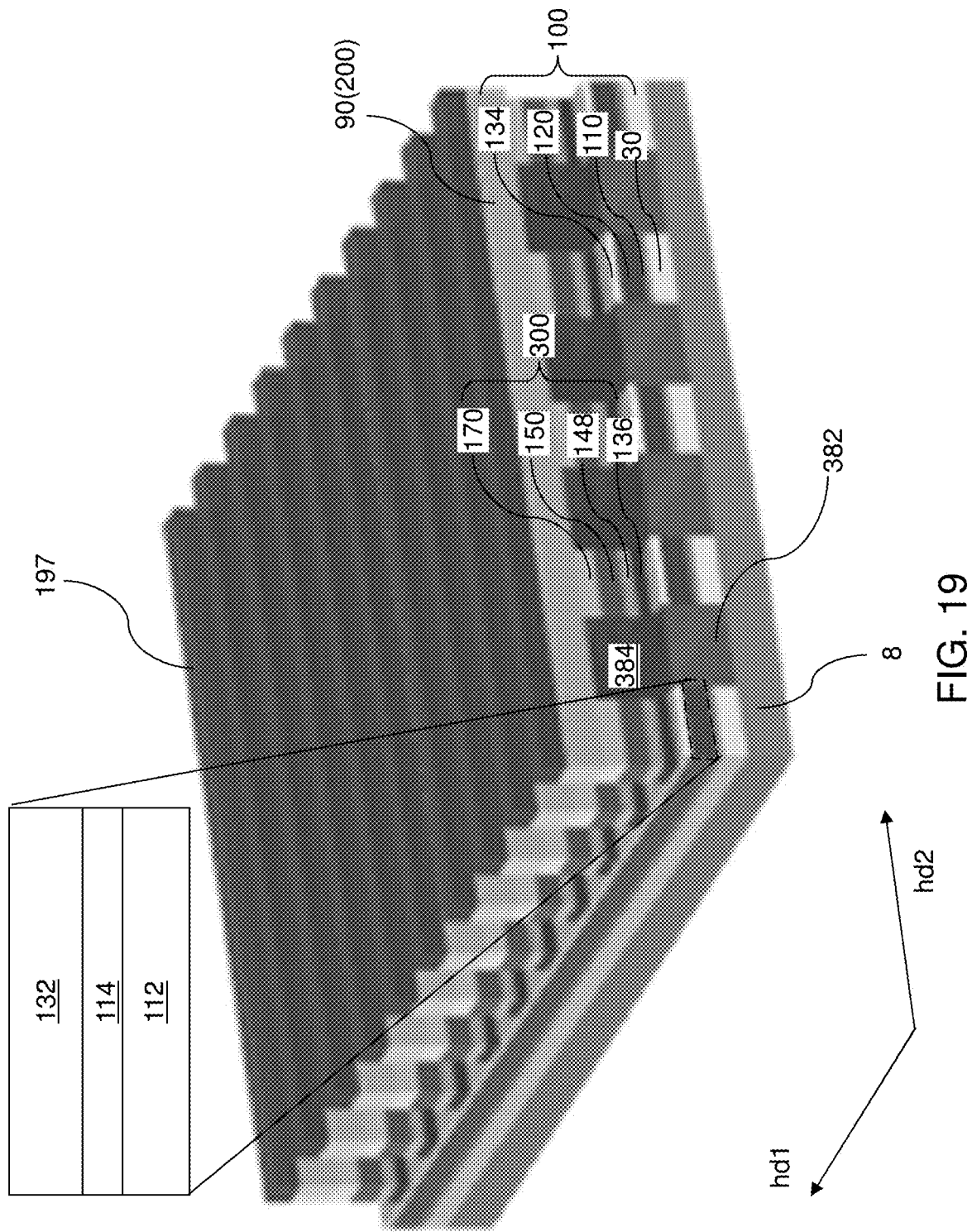
FIG. 19 illustrates a perspective view of the second exemplary structure after formation of a two-dimensional array of pillar structures and second electrically conductive lines according to the second embodiment of the present disclosure.

Referring to FIG. 19, the pattern in the second one-dimensional array of line-shaped masking material portions 197 is transferred through the second continuous electrically conductive layer 90L, the in-process rail structures 311, and upper portions of the in-process dielectric rail structures 380 by a second anisotropic etch process. The second anisotropic etch process can stop on top surfaces of the first rail structures 100, i.e., on the top surfaces of the nonmagnetic tunnel barrier layers 134. Line trenches extending along the second horizontal direction hd2 can be formed above the first rail structures 100. Top surfaces of the first rail structures 100 (such as the top surfaces of the nonmagnetic tunnel barrier layers 134) can be physically exposed at the bottom of the line trenches. The second continuous electrically conductive layer 90L is patterned into the second electrically conductive lines 90 by the second anisotropic etch process. Each second electrically conductive line 90 constitutes a second rail structure 200 that laterally extends along the second horizontal direction hd2. The second rail structures 200 can constitute a one-dimensional periodic array.

The in-process rail structures 311 are divided into a two-dimensional array of pillar structures 300. Specifically, the electrically conductive material rails 170R can be patterned into a two-dimensional array of electrically conductive material layers 170. The selector rail structures 150R can be patterned into a two-dimensional array of selectors 150. The electrically conductive capping rails 148R can be patterned into a two-dimensional array of electrically conductive capping layers 148. The free magnetization material rails 136R can be patterned into a two-dimensional array of free layers 136. Each pillar structure 300 can include a vertical layer stack including, from bottom to top, a free layer 136, an electrically conductive capping layer 148, a selector 150, and an electrically conductive material layer 170. In one embodiment, all sidewalls within a pillar structure 300 can be vertical or substantially vertical. In one embodiment, each element within a pillar structure 300 can have a respective rectangular horizontal cross-sectional shape. In one embodiment, each element within a respective pillar structure 300 can have a same rectangular horizontal cross-sectional shape. In one embodiment, all elements within the two-dimensional array of pillar structures 300 can have the same rectangular horizontal cross-sectional shape.

Remaining portions of each in-process dielectric rail structure 380 include a first dielectric rail structure 382 and a column of dielectric pillar structures 384 adjoined to upper surfaces of the first dielectric rail structures 382. Specifically, remaining portions of the in-process dielectric rail structures 380 that underlie the horizontal plane including the bottom surfaces of the line trenches constitutes first dielectric rail structures 382, which have a smaller height than the in-process dielectric rail structures 380. Remaining portions of the in-process dielectric rail structures 380 that overlie the horizontal plane including the bottom surfaces of the line trenches constitute a two-dimensional array of dielectric pillar structures 384, each of which is adjoined to a respective underlying in-process dielectric rail structure 380. The second one-dimensional array of line-shaped masking material portions 197 may be consumed during the second anisotropic etch process or may be removed after the second anisotropic etch process.

Generally, a two-dimensional array of pillar structures 300 can be formed by patterning a layer stack including at least the continuous free magnetization material layer 136L. Free magnetization material rails 136R may be formed as in-process structures, which are subsequently patterned to form a two-dimensional array of free layers 136. Each of the pillar structures 300 comprises a free layer 136 having energetically stable magnetization orientations that are parallel or antiparallel to the fixed magnetization direction of the reference layers 132, which can have the same magnetization direction as the continuous reference layer 132L. The two-dimensional array of pillar structures 300 can include a two-dimensional array of selectors 150. The two-dimensional array of selectors 150 is located within the two-dimensional array of the pillar structures 300 as a two-dimensional array of discrete selectors, i.e., discrete selectors without direct contact thereamongst.

In one embodiment, the pillar structures 300 within the two-dimensional array of pillar structures 300 can have first sidewalls that are vertically coincident with sidewalls of the first rail structures 100. The first sidewalls of the pillar structures 300 laterally extend along the first horizontal direction hd1. In one embodiment, the pillar structures 300 within the two-dimensional array of pillar structures 300 have second sidewalls that are vertically coincident with sidewalls of the second rail structures 200. The second sidewalls of the pillar structures 300 laterally extend along the second horizontal direction hd2.

Figure 20:
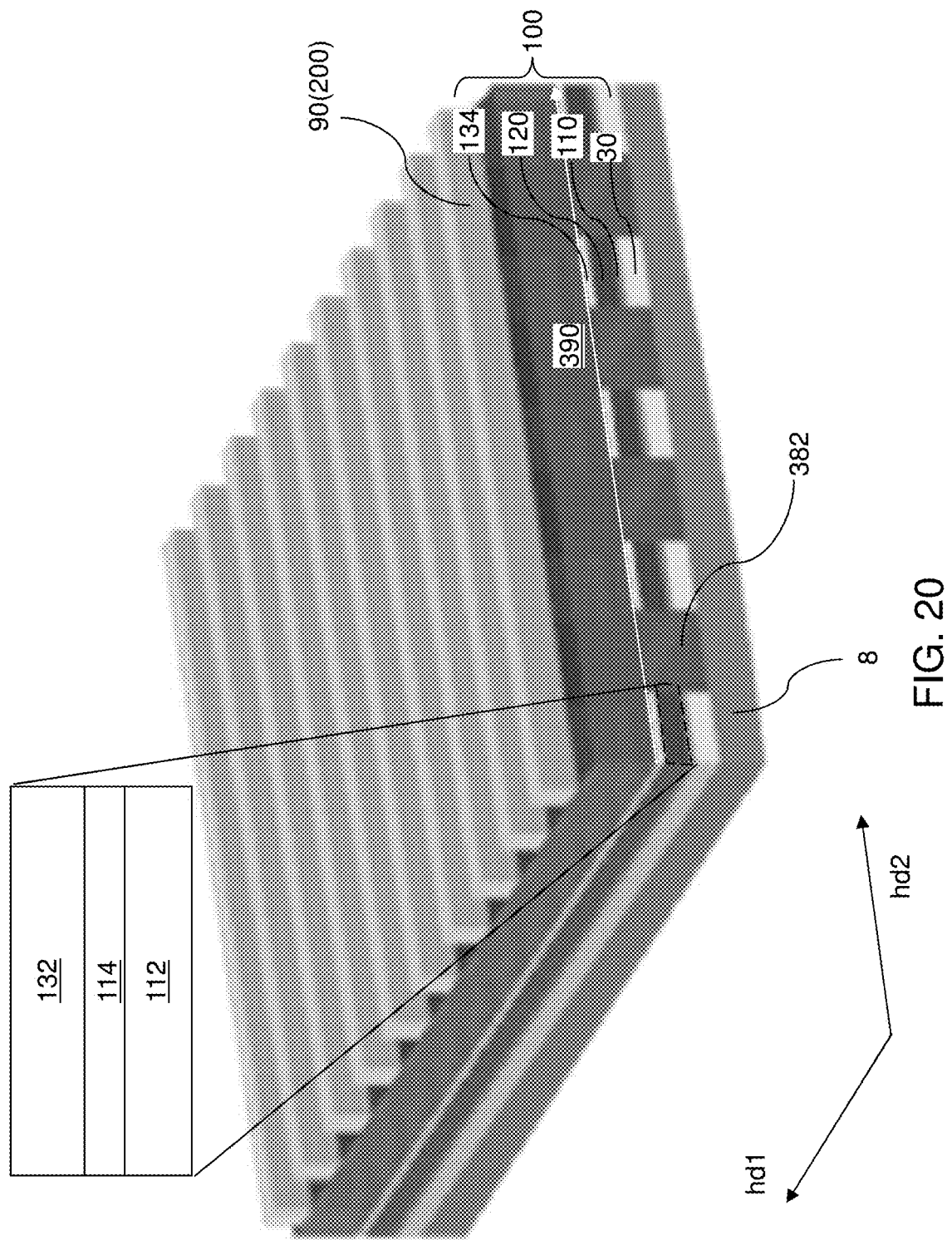
FIG. 20 illustrates a perspective view of the second exemplary structure after formation of second electrically conductive lines according to the second embodiment of the present disclosure.

Referring to FIG. 20, at least one dielectric material such as undoped silicate glass, a doped silicate glass, organosilicate glass, and/or a flowable oxide material can be deposited in the line trenches. Optionally, a dielectric liner (such as a silicon nitride liner and/or a dielectric metal oxide liner) can be deposited on the sidewalls of the line trenches. The at least one dielectric material (and the optional dielectric liner) can be removed from above the horizontal plane including the top surfaces of the second rail structures 200 by a planarization process such as a chemical mechanical polishing (CMP) process. Remaining portions of the at least one dielectric material located within a respective line trench constitute second dielectric rail structures 390. Each second dielectric rail structure 390 may contact top surfaces of the nonmagnetic tunnel barrier layers 134, and may have a top surface located within a same horizontal plane as the top surfaces of the second rail structures 200. The first dielectric rail structures 382 laterally extend along the first horizontal direction hd1, and the second dielectric rail structures 390 overlie, and contact, the first dielectric rail structures 382, and laterally extend along the second horizontal direction hd2.

In a third embodiment, the MRAM film stack including elements 30L, 110L, 120L and 134L is patterned into first rail structures (e.g., bottom metal lines) 100, similar to the step shown in FIG. 8. The continuous free magnetization material layer 136L is then patterned into discrete bits of the free layer 136, similar to the step shown in FIG. 5. Alternatively, the continuous free magnetization material layer 136L may be patterned together with the MRAM film stack including elements 30L, 110L, 120L and 134L into first rail structures (e.g., bottom metal lines) 100, followed by patterning the free magnetization material layer 136L discrete bits of the free layer 136. Thus, in the third embodiment, the step of forming the two-dimensional array of pillar structures comprises patterning only the continuous free magnetization material layer 136L, and wherein each of the pillar structures comprises only the free layer 136.

Referring to all drawings and according to various embodiments of the present disclosure, a memory device 500 including a two-dimensional array of spin-torque transfer (STT) MRAM cells 180 is provided. The two-dimensional array of STT MRAM cells 180 comprises: first rail structures 100 that laterally extend along a first horizontal direction hd1 and laterally spaced apart from each other, wherein each of the first rail structures 100 comprises a vertical stack including, from bottom to top, a first electrically conductive line 30, a reference layer 132 having a fixed magnetization direction, and a tunnel barrier layer 134; second rail structures (200, 201) that laterally extend along a second horizontal direction hd2 that is different from the first horizontal direction hd1 and laterally spaced apart from each other, wherein each of the second rail structures (200, 201) comprises a second electrically conductive line 90 that overlies the first rail structures 100; and a two-dimensional array of pillar structures (300, 301) located between a respective one of the first rail structures 100 and a respective one of the second rail structures (200, 201), wherein each of the pillar structures (300, 301) comprises a free layer 136 having energetically stable magnetization orientations that are parallel or antiparallel to the fixed magnetization direction of the reference layer 132.

In one embodiment, the memory device comprises a two-dimensional array of selectors 150 located within the two-dimensional array of the pillar structures 300 or within the second rail structures 201. In one embodiment, the two-dimensional array of selectors 150 is located within the two-dimensional array of the pillar structures 300 as a two-dimensional array of discrete selectors. In one embodiment, each of the pillar structures 300 further comprises a capping layer 148 located between a respective one of the free layers 136 and a respective one of the selectors 150; and an electrically conductive material layer 170 located between the respective one of the selectors 150 and a respective one of the second rail structures 200.

In one embodiment, the two-dimensional array of selectors is located within the second rail structures 201 and comprises portions of selector material rails 150R that extend along the second horizontal direction hd2; and each of the selector material rails 150R includes a respective column of selectors and contacts a respective underlying column of pillar structures 301 within the two-dimensional array of pillar structures 301. In one embodiment, each of the pillar structures 301 comprises a capping layer 148 located between a respective one of the free layers 136 and a respective one of the selector material rails 150R.

In one embodiment, the two-dimensional array of pillar structures (300, 301) has a sidewall segment that not parallel to the first horizontal direction hd1 and is not parallel to the second horizontal direction hd2. In one embodiment, each pillar structure (300, 301) within the two-dimensional array of pillar structures (300, 301) has a lateral extent along the second horizontal direction hd2 that is less than a width of a respective underlying one of the first rail structures 100 along the second horizontal direction hd2. In one embodiment, a pillar structure (300, 301) within the two-dimensional array of pillar structures (300, 301) has a sidewall segment that is parallel to the second horizontal direction hd2 and is laterally offset from sidewalls of a respective overlying one of the second rail structures (200, 201) along the first horizontal direction hd1.

In one embodiment, the pillar structures 300 within the two-dimensional array of pillar structures 300 have first sidewalls that are vertically coincident with sidewalls of the first rail structures 100. In one embodiment, the pillar structures 300 within the two-dimensional array of pillar structures 300 have second sidewalls that are vertically coincident with sidewalls of the second rail structures 200.

In one embodiment, each of the first rail structures 100 comprises an antiferromagnetic layer or a synthetic antiferromagnetic structure 120 including a vertical stack of a hard layer 112, a coupling layer 114, and a respective one of the reference layers 132.

In one embodiment, each of the first rail structures 100 comprises a seed layer 110 comprising at least one material selected from titanium, a CoFeB alloy, a NiFe alloy, and ruthenium and located between a respective one of the synthetic antiferromagnetic structures 120 and a respective one of the first electrically conductive lines 30.

The various embodiments of the present disclosure provide a two-dimensional cross-point array of STT MRAM cells 180 that can be manufactured in a high areal density configuration. Particularly, the first pitch and the second pitch may be at, or close to, the critical dimension of lithographic tools employed to pattern the two-dimensional array. The critical dimension refers to a minimum lithographic dimension that may be printed by direct transfer of a lithographic pattern formed by a single lithographic exposure and development (i.e., without employing non-lithographic assist techniques such as use of a pitch doubling spacer).

Furthermore, instead of patterning the whole MRAM film stack into a dense array of MRAM cells in one etching step, in the embodiments of the present disclosure, the patterning is split into two steps. The free layer is patterned into a dense bit array in one step, while the bottom half of the MRAM film stack (e.g., including the tunnel barrier layer, the reference layer and/or SAF structure, and the seed layer) is patterned into dense rail structures (e.g., dense lines) in another step. Thus, the free layer patterning step can stop on the tunnel barrier layer. This reduces or eliminates electrical shorting across the tunnel barrier layer. Still further, the bottom half of the MRAM film stack may include highly conductive metals, such as platinum layers in the hard layer of the SAF structure. Thus, the SAF structure may serve as part of the first (e.g., lower) electrically conductive line, such as a word line. The added conductivity of the platinum layers in the SAF structure allows the word line metal to be thinner. In some embodiments of the present disclosure, only the free layer is patterned into isolated bits, which permits tighter device pitch and less patterning of the device layers, which simplifies the device manufacturing process.

Still further, the location of two terminal selectors (150, 150R) in the cross-point array provides unique access to a memory cell without activating unselected cells without providing a dedicated substrate space for three terminal selectors (e.g., transistors) as in the prior art devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device including a two-dimensional array of spin- torque transfer MRAM cells, comprising:
    forming a layer stack comprising a first continuous electrically conductive layer, a continuous reference layer, a continuous nonmagnetic tunnel barrier layer, and a continuous free magnetization material layer over a substrate;
    forming first rail structures that laterally extend along a first horizontal direction and laterally spaced apart from each other by patterning a subset of layers within the layer stack, wherein each of the first rail structures comprises a vertical stack including, from bottom to top, a first electrically conductive line including a respective patterned portion of the first continuous electrically conductive layer, a reference layer including a respective patterned portion of the continuous reference layer, and a tunnel barrier layer including a patterned portion of the continuous nonmagnetic tunnel barrier layer;
    forming a two-dimensional array of pillar structures by patterning at least the continuous free magnetization material layer, wherein each of the pillar structures comprises a free layer having energetically stable magnetization orientations that are parallel or antiparallel to the fixed magnetization direction of the reference layer; and
    forming second rail structures that laterally extend along a second horizontal direction that is different from the first horizontal direction and laterally spaced apart from each other, wherein each of the second rail structures comprises a second electrically conductive line that overlies the two-dimensional array of pillar structures.

2. The method of claim 1, further comprising:
    forming a two-dimensional array of discrete masking material portions over the layer stack; and
    patterning the continuous free magnetization material layer by transferring a pattern of the two-dimensional array of discrete masking material portions through the continuous free magnetization material layer employing an anisotropic etch process that stops on the continuous nonmagnetic tunnel barrier layer.

3. The method of claim 2, further comprising:
    forming a one-dimensional array of line-shaped masking material portions that laterally extend along the first horizontal direction and laterally spaced apart along the second horizontal direction; and
    anisotropically etching the continuous nonmagnetic tunnel barrier layer, the continuous reference layer, and the first continuous electrically conductive layer employing the one-dimensional array of line-shaped masking material portions as an etch mask, whereby the first rail structures are formed.

4. The method of claim 1, further comprising forming dielectric material portions between neighboring pairs of the first rail structures, wherein the second rail structures are formed on top surfaces of the dielectric material portions and on top surfaces of a respective column of pillar structures of the two-dimensional array of pillar structures.

5. The method of claim 4, further comprising:
    forming a continuous selector material layer over the continuous free magnetization material layer; and
    patterning the continuous selector material layer and the continuous free magnetization material layer employing a two-dimensional array of discrete masking material portions as an etch mask, wherein each pillar structure within the two-dimensional array of pillar structures includes a respective selector that is a patterned portion of the continuous selector material layer.

6. The method of claim 1, further comprising:
    patterning the layer stack into the first rail structures and in-process rail structures that overlie the first rail structures by performing a first anisotropic etch process, wherein the in-process rail structures comprise patterned portions of the continuous free magnetization material layer;
    forming dielectric rail structures between neighboring pairs of the first rail structures and between neighboring pairs of the in-process rail structures;
    forming a second continuous electrically conductive layer over the in-process rail structures and the dielectric rail structures; and
    patterning the second continuous electrically conductive layer and the in-process rail structures by performing a second anisotropic etch process, wherein the second continuous electrically conductive layer is patterned into the second rail structures by the second anisotropic etch process, and the in-process rail structures are patterned into the two-dimensional array of pillar structures by the second anisotropic etch process.

7. The method of claim 6, wherein forming the two-dimensional array of pillar structures comprises patterning only the continuous free magnetization material layer, and wherein each of the pillar structures comprises only the free layer.

* * * * *